United States Patent
Li et al.

(10) Patent No.: US 11,496,060 B2
(45) Date of Patent: Nov. 8, 2022

(54) PULSE SHARING CONTROL FOR ENHANCING PERFORMANCE IN A MULTIPLE OUTPUT POWER CONVERTER SYSTEM

(71) Applicant: Power Integrations, Inc., San Jose, CA (US)

(72) Inventors: Yi Li, Cambridge (GB); Antonius Jacobus Johannes Werner, Cambridge (GB); David Michael Hugh Matthews, Los Gatos, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 16/951,156

(22) Filed: Nov. 18, 2020

(65) Prior Publication Data
US 2022/0158564 A1    May 19, 2022

(51) Int. Cl.
*H02M 3/335* (2006.01)
*H05B 45/382* (2020.01)
*H02M 1/44* (2007.01)
*H03K 5/24* (2006.01)
*H02M 1/00* (2006.01)

(52) U.S. Cl.
CPC ......... *H02M 3/33592* (2013.01); *H02M 1/44* (2013.01); *H03K 5/24* (2013.01); *H05B 45/382* (2020.01); *H02M 1/0025* (2021.05)

(58) Field of Classification Search
CPC .. H02M 3/33592; H02M 1/0025; H02M 1/44; H05B 45/382; H03K 5/24
See application file for complete search history.

(56) References Cited

U.S. PATENT DOCUMENTS

| | | | |
|---|---|---|---|
| 6,304,461 B1 | 10/2001 | Walker | |
| 6,434,026 B1 | 8/2002 | Malik et al. | |
| 6,504,267 B1 | 1/2003 | Giannopoulos | |
| 6,549,432 B1 * | 4/2003 | Giannopoulos ... | H02M 3/33561 363/21.14 |
| 7,679,937 B2 | 3/2010 | Wingrove et al. | |
| 7,923,943 B2 | 4/2011 | Peker et al. | |
| 8,179,110 B2 | 5/2012 | Melanson | |
| 10,218,282 B1 * | 2/2019 | Moore ................. | H05B 45/385 |

(Continued)

OTHER PUBLICATIONS

PCT App. No. PCT/US2020/024403, "International Search Report and Written Opinion dated Jul. 8, 2020", Power Integrations, Inc., 13 pgs.

(Continued)

*Primary Examiner* — Jue Zhang
(74) *Attorney, Agent, or Firm* — Brian H. Floyd

(57) ABSTRACT

Pulse sharing control to enhance performance in multiple output power converters is described herein. During a switching cycle, an energy pulse is provided to more than one port (i.e., output) using pulse sharing transfer. Pulse sharing transfer may enhance performance by reducing audible noise due to subharmonics and by reducing a root mean square current of one or more secondary currents. A primary switch is closed to energize an energy transfer element via a primary current. Energy may be shared among a first load port on a first circuit path via a first secondary current and among a second load port on a second circuit path via a second secondary current.

22 Claims, 17 Drawing Sheets

(56) References Cited

U.S. PATENT DOCUMENTS

| | | |
|---|---|---|
| 2004/0046536 A1 | 3/2004 | Librizzi |
| 2007/0121350 A1 | 5/2007 | Duvnjak |
| 2009/0212758 A1 | 8/2009 | Asinovski et al. |
| 2009/0322257 A1 | 12/2009 | Kim et al. |
| 2011/0051469 A1 | 3/2011 | Cyr |
| 2015/0002042 A1 | 1/2015 | Kim et al. |
| 2015/0015071 A1 | 1/2015 | Deboy et al. |
| 2016/0359420 A1 | 12/2016 | Chen |
| 2016/0365794 A1 | 12/2016 | Lawson et al. |
| 2018/0351463 A1 | 12/2018 | Werner et al. |
| 2020/0313561 A1 | 10/2020 | Moore et al. |

OTHER PUBLICATIONS

European Patent Application No. 21207495.9, Extended European Search Report dated Apr. 4, 2022; 8 pages.
Indian Patent Application No. 202114051552, Examination Report dated Sep. 7, 2022, 6 pages.

\* cited by examiner

PULSE SHARING CONTROL FOR ENHANCING PERFORMANCE IN A MULTIPLE OUTPUT POWER CONVERTER SYSTEM

FIELD OF THE DISCLOSURE

The present invention relates to pulse sharing control in a multiple output power converter and more particularly to reducing audible noise with pulse sharing transfer in a multiple output power converter system.

BACKGROUND INFORMATION

Many electronic devices, such as cell phones, laptops, etc., are powered by direct current (dc) power derived from a power supply. Conventional wall outlets generally deliver a high voltage alternating current (ac) power that needs to be converted to regulated dc power in order to be used as a power source for consumer electronic devices. Switch mode power converters, also referred to as switch mode power supplies (SMPSs), are commonly used due to their high efficiency, small size, and low weight to convert a high voltage ac power to a regulated dc power.

Many electronic devices have multiple loads and require more than one dc power source in order to operate. For instance, an audio electronic device may have system components which operate at five volts and audio components which operate between twelve and twenty volts. In these applications a multiple output power converter converts ac power to multiple dc power outputs to provide regulated dc power to each of the multiple loads, namely the system components and the audio components. In some applications the regulated dc power outputs are regulated constant current (CC) outputs and/or regulated constant voltage (CV) outputs.

BRIEF DESCRIPTION OF THE DRAWINGS

Non-limiting and non-exhaustive embodiments of pulse sharing in multiple output power converter systems are described with reference to the following figures, wherein like reference numerals refer to like parts throughout the various views unless otherwise specified.

Figure 1A:
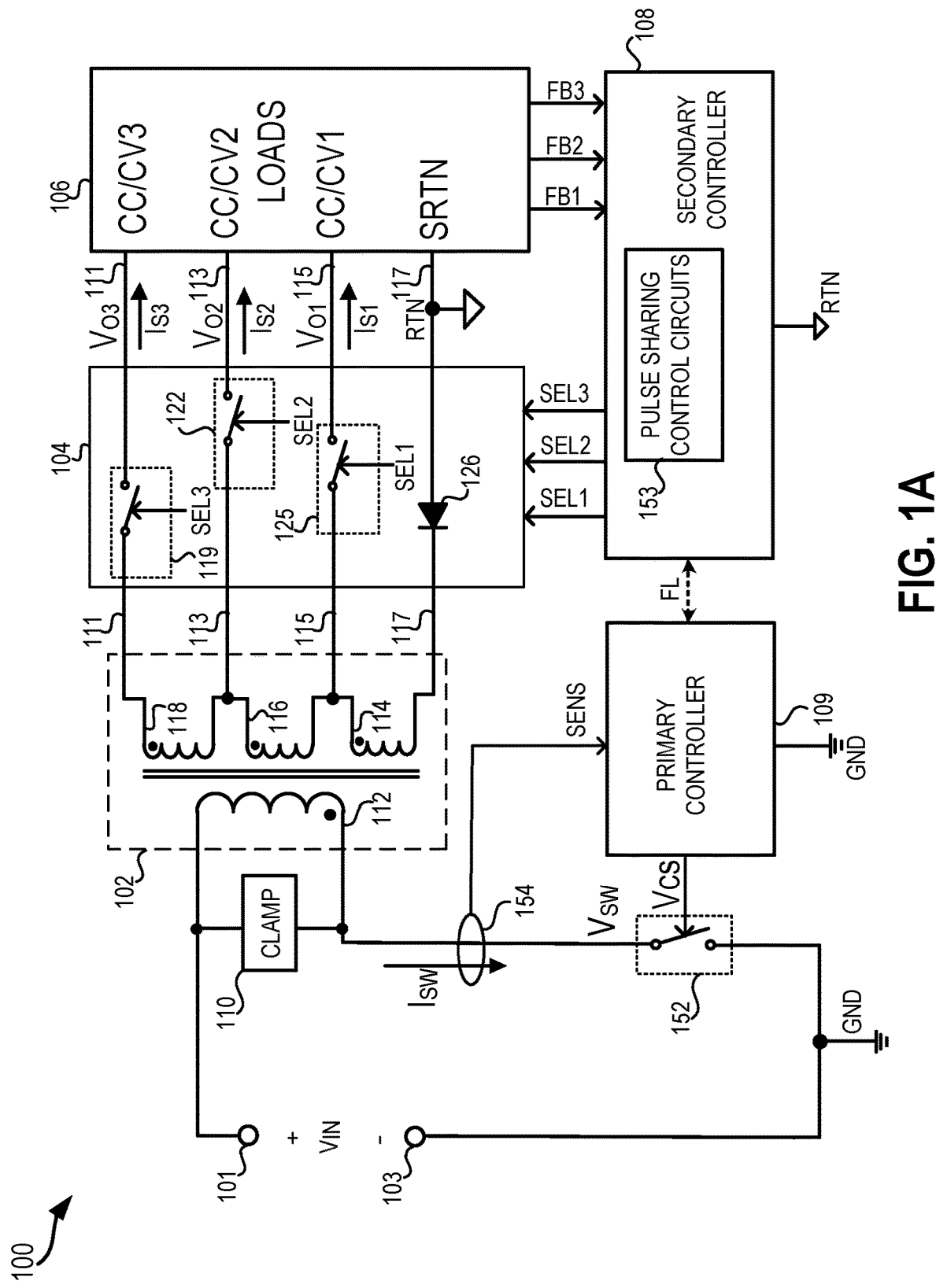
FIG. 1A illustrates a multiple output power converter system according to the teachings herein.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the teachings herein. Also, common but well-understood elements that are useful or necessary in a commercially feasible embodiment are often not depicted in order to facilitate a less obstructed view of these various embodiments of pulse sharing in multiple output power converter systems.

DETAILED DESCRIPTION

In the following description, numerous specific details are set forth in order to provide a thorough understanding of pulse sharing in multiple output power converter systems. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure or characteristic described in connection with the embodiment or example is included in at least one embodiment of a multiple output switch-mode power converter system. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, in one embodiment, a high-voltage transistor comprises an N-channel metal-oxide-semiconductor (NMOS) field-effect transistor (FET) with the high-voltage being supported between the first terminal, a drain, and the second terminal, a source. In some embodiments an integrated controller circuit may be used to drive a power switch when regulating energy provided to a load. Also, for purposes of this disclosure, "ground" or "ground potential" refers to a reference voltage or potential against which all other voltages or potentials of an electronic circuit or integrated circuit (IC) are defined or measured. Additionally, according to power electronics theory (i.e., power is related to the rate of change of energy), "power" transfer may be implied by "energy" transfer; conversely, "energy" transfer may be implied by "power" transfer.

As mentioned above, a multiple output power converter may be used to provide regulated dc power to multiple loads. The loads can be passive and/or active loads including discrete semiconductor devices, microprocessors, controllers, mixed signal circuit components, and the like. In providing regulated dc power, the multiple output power converter may regulate output current to a constant current (CC) output and/or regulate output voltage to a constant voltage (CV) output. Additionally, system voltages may be defined relative to how the multiple output power converter provides power. For instance, a multiple output power converter may provide a CC output operating at approximately fifty volts, a CV output regulated to twelve volts, and a CV output regulated to five volts.

As will be further described herein, power may be transferred via an energy transfer element (e.g., a transformer) from a primary side to a secondary side according to a switching cycle. For instance, a primary switch may switch according to a switching cycle whereby a primary winding receives input power for part of the switching cycle and one or more secondary windings provide power for another part of the switching cycle. When power is transferred such that current in a secondary side winding (i.e., a secondary current) reduces to substantially zero before the completion of a switching cycle, then the mode of operation may be referred to as discontinuous conduction mode (DCM). Alternatively, when power (i.e., energy) is transferred such that current in secondary side winding does not reduce to zero before completion of a switching cycle, then the mode of operation may be referred to as continuous conduction mode (CCM).

Additionally, during a single switching cycle (i.e., single switching period), power (i.e., energy) may be transferred to a select one of multiple outputs. This form of energy transfer may be classified as single pulse transfer or single pulse control whereby secondary current flows to a selected output based upon power demand. As an example, a multiple output power converter system may be configured to deliver a total of forty watts (40 W) power to two outputs: a CC output and a CV output. If the CC output demands 20 W and the CV output demands 20 W, then during a first switching cycle the multiple output power converter system may deliver energy to the CC output and during a subsequent switching cycle may deliver energy to the CV output. If the switching cycles (periods) are periodic with a harmonic frequency of sixty kilohertz (60 kHz), then energy (i.e., power) pulses may be evenly multiplexed at subharmonic frequencies of 30 kHz to divide the 40 W evenly among the CC and CV outputs.

However, single pulse transfer may become problematic when the demand for power varies unevenly among the multiple outputs. For instance, if the CC output demands 30 W and the CV output demands 10 W, then the multiple output power converter system may vary the subharmonic frequency of the CV output to be approximately one fourth of the fundamental switching frequency. If the fundamental switching frequency is 60 kHz, then the subharmonic of the CV output would become 15 kHz. This would cause the transformer to vibrate and emit undesirable noise at 15 kHz within the audible band. Accordingly, there is a need to develop an alternative to single pulse transfer.

Pulse sharing control to enhance performance in multiple output power converters is described herein. During a switching cycle, an energy pulse is provided to more than one port (i.e., output) using pulse sharing transfer. Pulse sharing transfer may enhance performance by reducing audible noise due to subharmonics and by reducing a root mean square current to one or more of the CC/CV outputs. A primary switch is closed to energize an energy transfer element via a primary current. Energy may be shared among a first load port on a first circuit path via a first secondary current and among a second load port on a second circuit path via a second secondary current.

FIG. 1A illustrates a multiple output power converter system 100 according to the teachings herein. The multiple output power converter system 100 includes an energy transfer element 102, a secondary switches block 104, multiple loads 106, a secondary controller 108, a primary controller 109, a clamp 110, and a primary switch 152. The energy transfer element 102 includes a primary winding 112 and secondary windings 114, 116, 118. The secondary switches block 104 includes diode 126, and secondary switches 119, 122, 125.

The multiple output power converter system 100 may convert input power derived from a rectified ac line voltage VIN into output power including multiple output voltages $V_{O1}$-$V_{O3}$, and secondary currents $I_{S1}$-$I_{S3}$. Alternatively, and additionally, input power may be derived from a high voltage power source. The multiple loads 106 include a CC/CV3 port, a CC/CV2 port, a CC/CV1 port, which may be regulated dc power ports, and a secondary ground return port SRTN.

Additionally, the CC/CV3 port may be a constant current (CC) port (i.e., secondary current $I_{S3}$ controlled to be constant) and/or constant voltage (CV) port (i.e., output voltage $V_{O3}$ controlled to be constant) depending on load conditions at the CC/CV3 port. The CC/CV2 port may be a constant current (CC) port (i.e., secondary current $I_{S2}$ controlled to be constant) and/or constant voltage (CV) port (i.e., output voltage $V_{O2}$ controlled to be constant) depending on load conditions at the CC/CV2 port; and the CC/CV1 port may be a constant current (CC) port (i.e., secondary current $I_{S1}$ controlled to be constant) and/or constant voltage (CV) port (i.e., output voltage $V_{O1}$ controlled to be constant) depending on load conditions at the CC/CV1 port.

For instance, in one embodiment the CC/CV3 port may be a CC port and secondary current $I_{S3}$ may be a regulated load current while output voltage $V_{O3}$ is determined, at least in part, by a load of the CC/CV3 port. Additionally, the CC/CV1 port and the CC/CV2 port may be CV ports whereby output voltage $V_{O1}$ and output voltage $V_{O2}$ are regulated. The secondary ground return port SRTN may be electrically coupled to secondary ground RTN.

In one embodiment, output voltages $V_{O1}$-$V_{O3}$ may be determined, at least in part, by the energy transfer element 102. For instance, turns winding ratios of the secondary windings 114, 116, 118 with primary winding 112 and transformer construction (e.g., a stacked secondary windings) may be configured for a highest voltage CC/CV3 port (e.g., a voltage greater than forty volts). The CC/CV1 port and CC/CV2 port may be regulated to lower voltages (e.g., voltages between three and forty volts). In one embodiment the CC/CV2 port may be a CV port with output voltage $V_{O2}$ regulated to a lower voltage (e.g., twenty volts); and the CC/CV1 port may be a CV port with output voltage $V_{O1}$ regulated to a lowest voltage (e.g., five volts).

Alternatively, and additionally, the output voltages $V_{O1}$-$V_{O3}$ may be determined by the operation of secondary switches 119, 122, 125. For instance, secondary switch 119 may be controlled such that the output voltage $V_{O3}$ is less than output voltage $V_{O1}$.

As illustrated, secondary windings 114, 116, and 118 are electrically coupled in a stacked (i.e., series) configuration according to transformer "dot" notation. As shown, secondary switch 119 is electrically coupled between the "dot" terminal of secondary winding 118 and the CC/CV3 port on a circuit path 111. Secondary switch 122 is electrically coupled between the "dot" terminal of secondary winding 116 and the CC/CV2 port on a circuit path 113; and secondary switch 125 is electrically coupled between the "dot" terminal of secondary winding 114 and the CC/CV1 port on a circuit path 115. Additionally, diode 126 is electrically coupled between the second terminal of secondary winding 114 and the secondary ground return port SRTN on a circuit path 117.

Also as illustrated the primary winding 112 and the primary switch 152 can be connected between input terminals 101, 103 to receive rectified ac line voltage VIN relative to a primary ground GND. During a switching cycle (i.e., switching period), while the primary switch 152 is closed (i.e., conducting), the primary winding 112 may be energized by an increasing (i.e., ramping) primary current $I_{SW}$. According to the theories of magnetics and transformers, when the primary switch 152 is opened (i.e., transitions from conducting state to a blocking state), energy within the primary winding 112 may be transferred to one or more of the secondary windings 114, 116, 118.

Primary controller 109 provides a primary control signal $V_{CS}$ to a control terminal (e.g., a gate) of the primary switch 152. In this manner the primary controller 109 controls the primary current $I_{SW}$ for energizing primary winding 112. The primary sense element 154 may provide a sense signal SENS to the primary controller to locally regulate a maximum value of the primary current $I_{SW}$; additionally, the clamp 110 may be connected in parallel with the primary winding 112 to limit (i.e., clamp) the switch voltage $V_{SW}$. As illustrated, the primary controller 109 may be configured to operate with signals (e.g., switch voltage $V_{SW}$ and primary control signal $V_{CS}$) which are referenced to primary ground GND.

Secondary controller 108 receives feedback signals FB1-FB3 from the multiple loads 106, communicates with the primary controller 109 through a signal FL, and provides control signals SEL1-SEL3 to the secondary switches block 104. As illustrated, the secondary controller 108 may be configured to operate with signals (e.g., feedback signals FB1-FB3 and multiple output voltages $V_{O1}$-$V_{O3}$) which are referenced to the secondary ground RTN. Accordingly, the signal FL may be an optically coupled, magnetically coupled, and/or capacitively coupled signal FL to allow communication with the primary controller 109, which is referenced to primary ground GND.

As described herein, the secondary controller 108 may provide one or more control signals SEL1-SEL3 to selectively control (i.e., switch) the transfer of energy (i.e., power) to the multiple loads 106 by selecting circuit paths (e.g., circuit path 111, circuit path 113, and/or circuit path 115). As illustrated, secondary controller 108 provides control signals SEL1, SEL2, SEL3 to secondary switches 125, 122, 119, respectively. Control signals SEL1, SEL2, SEL3 may, in turn, respectively gate switches 125, 122, 119 to operate in the on-state or off-state.

During a switching cycle, energy may be transferred via secondary current $I_{S3}$ on circuit path 111 when secondary switch 119 is closed (i.e., operates in the on-state) while both secondary switches 125, 122 are open (i.e., both operate in the off-state). As illustrated, circuit path 111 is a switched circuit path including secondary switch 119 and electrically coupled to the CC/CV3 port of multiple loads 106. Alternatively, when secondary switch 122 is closed (i.e., operates in the on-state) and secondary switches 125, 119 are open (i.e., operate in the off-state) energy may be transferred via secondary current $I_{S2}$ on circuit path 113. As illustrated, circuit path 113 is a switched circuit path including secondary switch 122 and electrically coupled to the CC/CV2 port of multiple loads 106. Alternatively, when secondary switch 125 is closed (i.e., operates in the on-state) and secondary switches 122, 119 are open (i.e., operate in the off-state) energy may be transferred via secondary current $I_{S1}$ on circuit path 115. As illustrated, circuit path 115 is a switched circuit path including secondary switch 125 and electrically coupled to the CC/CV1 port of multiple loads 106.

According to the teachings herein, secondary controller 108 includes pulse sharing control circuits 153. The pulse sharing control circuits 153 may allow (i.e., may control) energy sharing to different ports of the multiple loads 106 by providing one or more of the control signals SEL1, SEL2, SEL3 to the secondary switches block 104. Energy may be shared on circuit path 111, circuit path 113, and/or circuit path 115. For instance, during a switching cycle, energy may be shared to both the CC/CV3 port and to the CC/CV2 port of the multiple loads 106 by first transferring energy via secondary current $I_{S3}$ and subsequently transferring energy via secondary current $I_{S2}$.

Figure 1B:
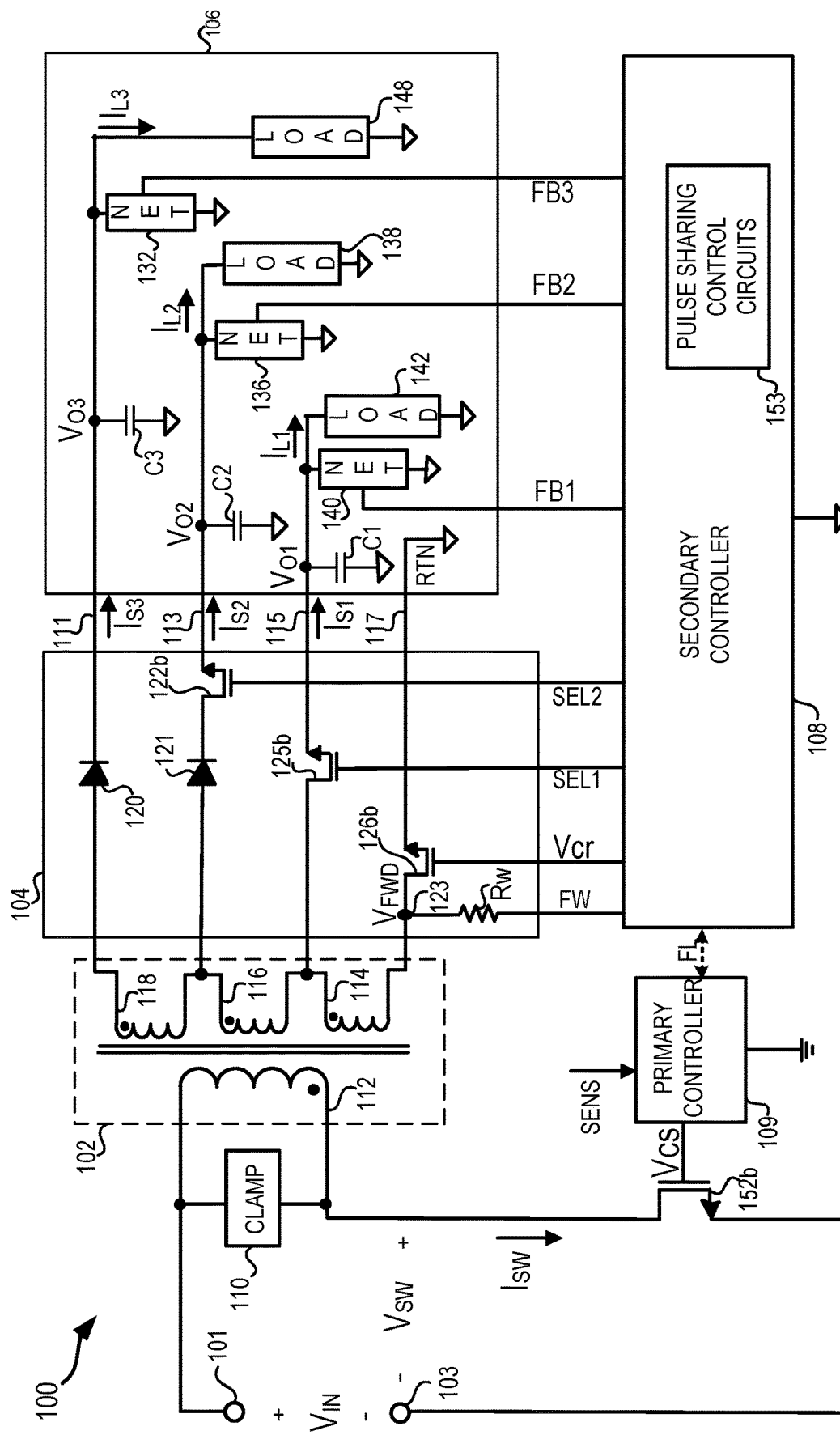
FIG. 1B illustrates a multiple output power converter system according to an embodiment of FIG. 1A.

FIG. 1B illustrates a multiple output power converter system 100 according to an embodiment of FIG. 1A. Primary switch 152 is realized with an N-type field effect transistor (FET) 152b. Secondary switch 119 is replaced with a diode 120. As illustrated, diode 120 is electrically coupled between the "dot" terminal of secondary winding 118 and the CC/CV3 port on circuit path 111. In applications where the output voltage $V_{O3}$ is necessarily the greatest of the multiple output voltages $V_{O1}$-$V_{O3}$, then secondary switch 119 may be replaced by diode 120 to advantageously simplify the switches block 104 and obviate the need for control signal SEL3.

Secondary switch 122 is realized with an N-type FET 122b; as illustrated secondary switch 122 is electrically coupled with a diode 121 between the "dot" terminal of secondary winding 116 and the CC/CV2 port on circuit path 113. Secondary switch 125 is realized with N-type FET 125b; secondary switch 125b is electrically coupled between the "dot" terminal of secondary winding 114 and the CC/CV1 port on circuit path 115. Secondary diode 126 is replaced with N-type FET 126b coupled between secondary winding 114 and secondary RTN in circuit path 117 as shown. As one of ordinary skill in the art may appreciate, FET 126b may be configured to operate as a synchronous rectifier as an alternative to diode 126. For instance, the N-type FET 126b may be switched on and off by control signal Vcr to operate as a synchronous rectifier.

The N-type FETs 152b, 122b, 125b, 126b may be integrated and/or discrete power FETs. In one embodiment the N-type FETs 152b, 122b, 125b, 126b may be enhancement mode FETs.

The multiple loads 106 include feedback networks 140, 136, 132 which can respectively provide feedback signals FB1, FB2, FB3 to the secondary controller 108. Additionally, the multiple loads 106 include filter capacitors C1-C3 electrically coupled to the first load 142, second load 138, and the third load 148, respectively. In the steady state the multiple output power converter system 100 of FIG. 1B can be configured to regulate the power delivered to the first load 142, second load 138, and third load 148.

For instance, feedback networks 140, 136, 132 may comprise divider networks to provide feedback signals FB1, FB2, FB3 for closed loop regulation of output voltages $V_{O1}$, $V_{O2}$, $V_{O3}$, respectively. In the steady state the feedback signals FB1, FB2, FB3 may be voltages derived or sampled from the output voltages $V_{O1}$, $V_{O2}$, $V_{O3}$, respectively. In this manner power delivered to the first load 142 may be regulated as a CV output (i.e., regulated output voltage Vo1). Power delivered to the second load 138 may be regulated as a CV output (i.e., regulated output voltage $V_{O2}$); and power delivered to the third load 148 may be regulated as a CV output (i.e., regulated output voltage $V_{O3}$).

As described above, secondary controller 108 may communicate with primary controller 109 via the signal FL (e.g., a magnetically coupled signal FL). For instance, using the signal FL, the primary controller 109 may transmit a handshake to the secondary controller 108 to indicate a power good condition. Alternatively and additionally, using the signal FL, the secondary controller 108 may transmit a request for more energy transfer. In response to the request, the primary controller 109 may vary primary control signal $V_{CS}$ to close primary switch 152 and to energize the primary winding 112.

As illustrated, secondary controller 108 may receive a forward pin signal FW and feedback signals FB1-FB3; and secondary controller 108 may provide control signals SEL1, SEL2, and $V_{C}r$. As discussed herein control signals SEL1, SEL2 may be used to selectively control (i.e., switch) the transfer of energy (i.e., power) to the multiple loads 106 by selecting circuit paths (e.g., circuit path 111, circuit path 113, and/or circuit path 115). Additionally, control signal Vcr may be used to drive the gate of N-type FET 126b to operate as a synchronous rectifier.

As discussed above feedback signals FB1-FB3 may be sampled (i.e., measured) signals used within the secondary controller 108 for closed loop control of CV outputs. However, as one of ordinary skill in the art may appreciate, other configurations are possible. For instance, as discussed herein, the secondary controller 108 may also be configured to provide closed loop control of a CC output.

As illustrated, a forward pin voltage $V_{FWD}$ may exist at node 123; and an optional passive component (i.e., resistor $R_{W}$) may be electrically coupled between the secondary winding 114 at node 123 to provide the forward pin signal FW to the secondary controller 108. In some embodiments the forward pin signal FW may be equivalent to forward pin voltage $V_{FWD}$ while in other embodiments the forward pin signal FW may be attenuated with respect to forward pin voltage $V_{FWD}$.

Figure 1C:
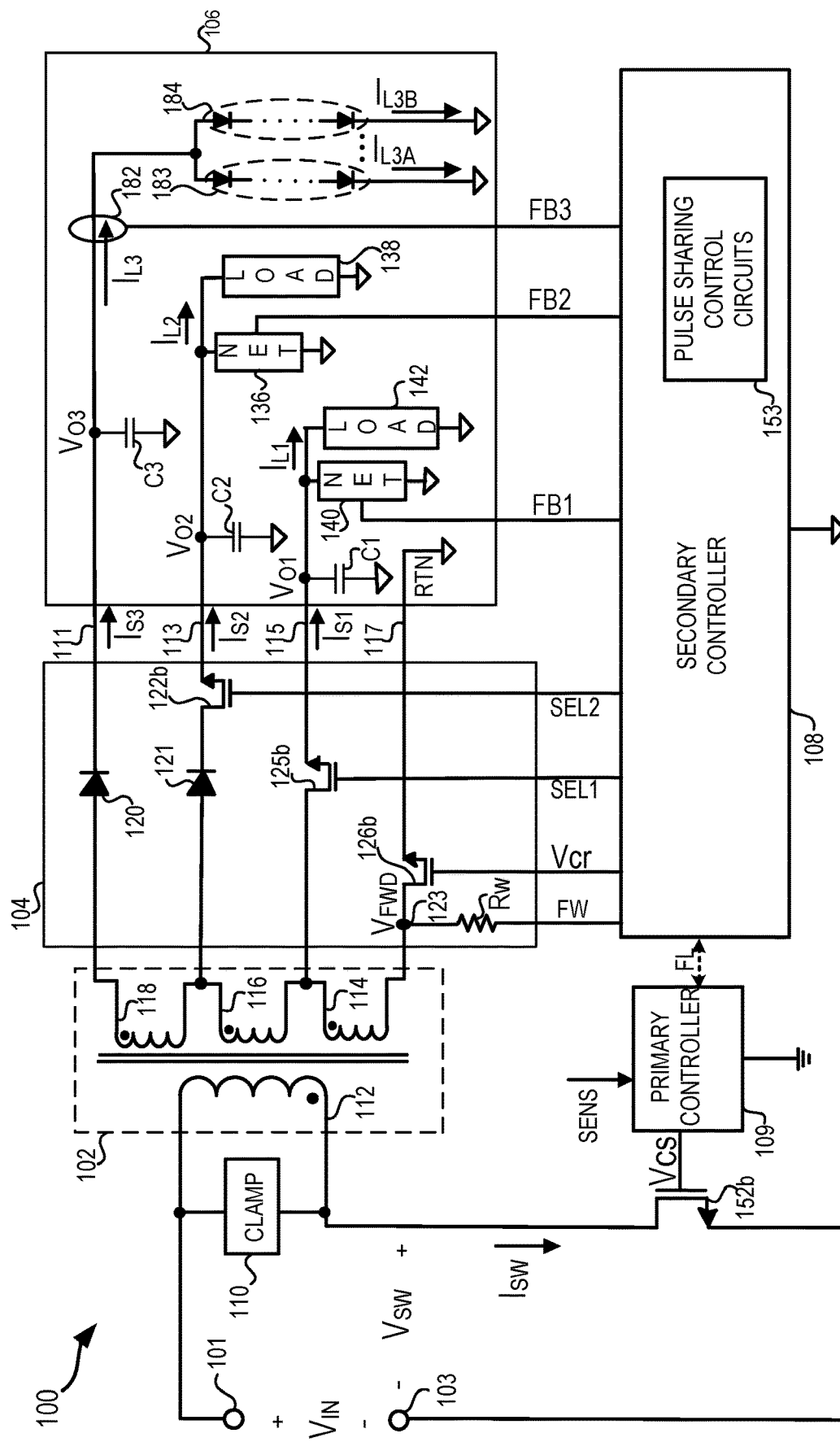
FIG. 1C illustrates a multiple output power converter system according to another embodiment of FIG. 1A.

FIG. 1C illustrates a multiple output power converter system 100 according to another embodiment of FIG. 1A. The embodiment of FIG. 1C is similar to the embodiment of FIG. 1B, except the load is replaced by LED strings 183-184; and a current sense element 182 samples load current $I_{L3}$ to provide feedback signal FB3. In the steady state the multiple output power converter system 100 of FIG. 1C can be configured to regulate the power delivered to the LED strings 183-184 as a CC output (i.e., regulated load current $I_{L3}$).

Additionally, the multiple loads 106 include multiple parallel-connected light emitting diode (LED) strings 183-184, a first load 142, and a second load 138. As illustrated, the LED strings 183-184 demand (i.e., receive) the load current $I_{L3}$; and although feedback signal FB3 is shown as sampling load current $I_{L3}$ directly, other configurations are possible. For instance, load current $I_{L3}$ may be regulated by sampling the LED string currents $I_{L3A}$-$I_{L3B}$ instead of directly sampling load current $I_{L3}$; and LED string currents $I_{L3A}$-$I_{L3B}$ may be used by secondary controller 108 to regulate total load current $I_{L3}$.

In one embodiment, LED string currents $I_{L3A}$-$I_{L3B}$ may be used by secondary controller 108 to regulate output voltage $V_{O3}$ as means to control the total load current $I_{L3}$. Additionally, although the multiple loads 106 are shown as having two LED strings 183, 184, other configurations having greater or fewer than two LED strings 183, 184 are possible.

Also, as one of ordinary skill in the art can appreciate the embodiments of FIG. 1A-1C are non-limiting, and other configurations may be realized using integrated and/or discrete semiconductor components including insulated gate bipolar transistors (IGBTs) and/or opposite polarity FETs (e.g., P-channel FETs). Additionally, active devices may be realized using material processes based on silicon, silicon germanium, gallium nitride, and the like.

Figure 2A:
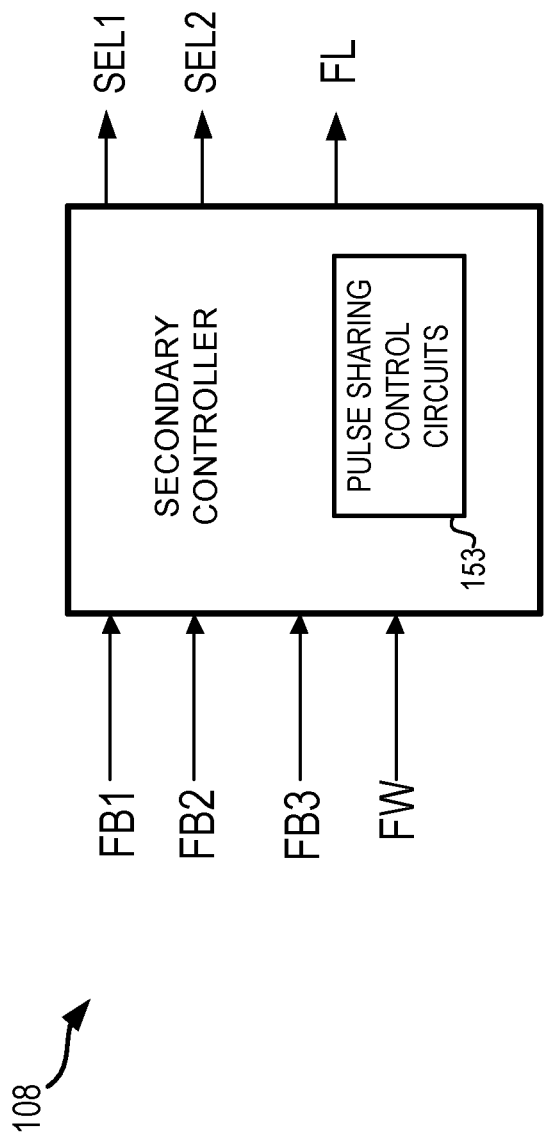
FIG. 2A illustrates a simplified schematic symbol of the secondary controller with pulse sharing control circuits according to an embodiment.

FIG. 2A illustrates a simplified schematic symbol of secondary controller 108 with pulse sharing control circuits 153 according to an embodiment. As described herein the secondary controller 108 may receive feedback signals FB1-FB3 and forward voltage signal FW, and may provide control signals SEL1, SEL2 and communicate with the signal FL. According to the teachings herein the secondary controller 108 may include pulse sharing control circuits 153. Using pulse sharing control circuits 153, the secondary controller 108 may provide control signals SEL1, SEL2 to selectively control (i.e., switch) the transfer of energy (i.e., power) to the multiple loads 106 by selecting circuit paths (e.g., circuit path 111, circuit path 113, and/or circuit path 115).

Figure 2B:
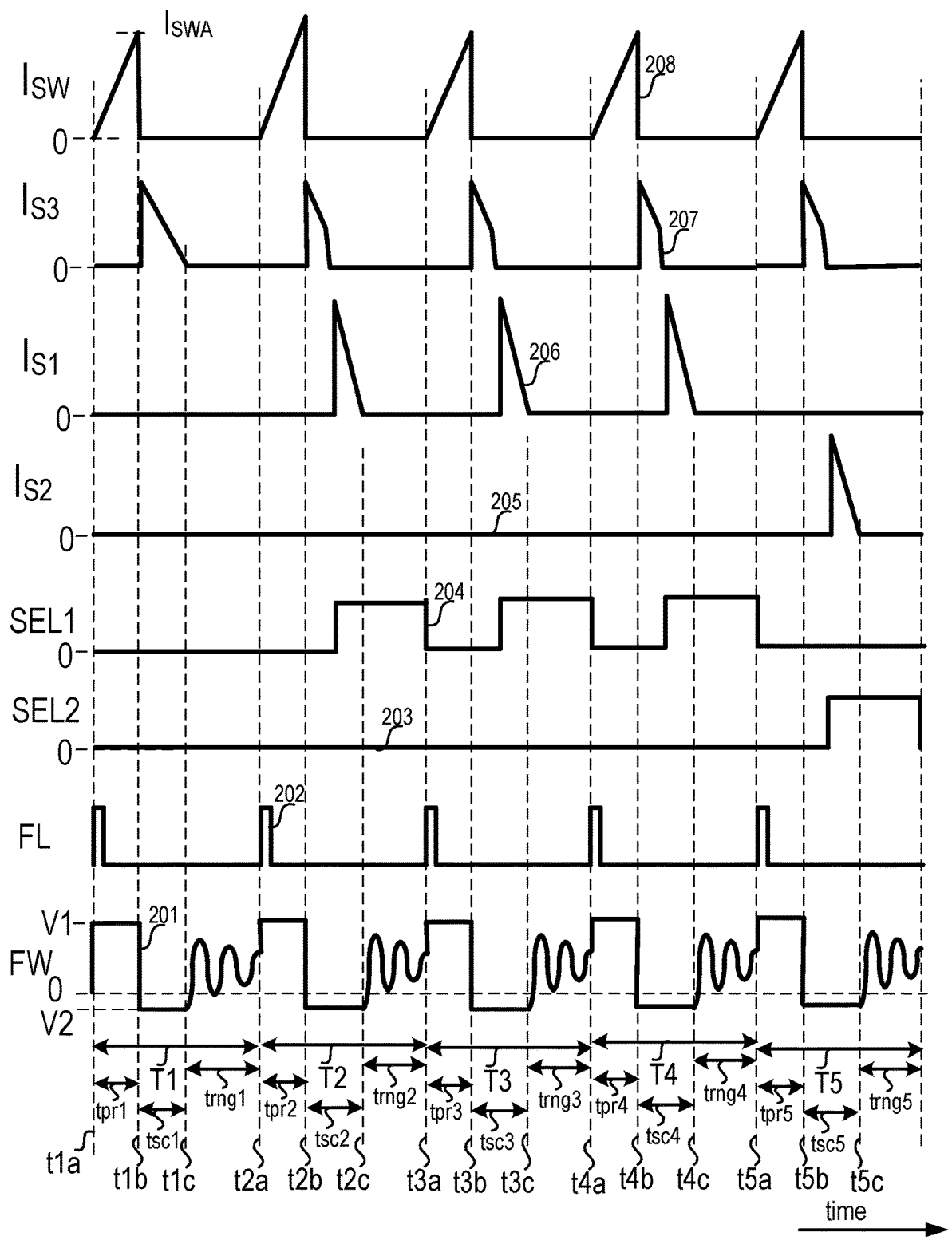
FIG. 2B illustrates waveforms during switching periods according to a pulse sharing embodiment.

FIG. 2B illustrates waveforms 201-208 during switching periods T1-T5 according to a pulse sharing embodiment. Waveforms 201-208 can be DCM steady state waveforms of the forward pin signal FW, signal FL, control signal SEL2, control signal SEL1, secondary current $I_{S2}$, secondary current $I_{S1}$, secondary current $I_{S3}$, and primary current $I_{SW}$, respectively. Additionally, although waveforms 201-208 may be DCM steady state waveforms, other waveforms are possible. For instance, the teachings herein may also be applicable to CCM.

At times t1a-t5a the signal FL transitions from low to high communicating a request from the secondary controller 108 to the primary controller 109. In response to the signal FL, the primary controller 109 may close the primary switch (e.g., primary switch 152, 152b).

Accordingly, at times t1a-t5a the waveform 208 of primary current $I_{SW}$ begins to increase until the primary switch (e.g., primary switch 152, 152b) opens (i.e., turns off) at times t1b-t5b. The time intervals tpr1-tpr5 may indicate the duration (e.g., five microseconds) the primary switch 152 remains closed, whereby the primary winding 112 is energized by primary current $I_{SW}$. In one embodiment the primary controller 109 may determine the time intervals tpr1-tpr5. For instance, at time t1b the primary controller 109 may turn off the primary switch 152 in response to the sense signal SENS, whereby the primary controller 109 limits a peak value of the primary current $I_{SW}$ to a desired (i.e., target) peak current (e.g., peak current $I_{SWA}$ of waveform 208).

During switching period T1 at time t1b, the primary switch 152 opens and energy may transfer from the primary winding 112 to one or more of the secondary windings 114, 116, 118. During switching period T1, control signals SEL1, SEL2 are logic low as indicated by waveforms 204 and 203 (e.g., zero volts). Thus, during switching period T1, energy received in the primary winding 112 during the time interval tpr1 may be transferred on circuit path 111; and as indicated by waveform 207, the energy may be transferred via secondary current $I_{S3}$, which is illustrated as decreasing, during time interval tsc1.

During switching periods T2-T4 on time intervals tsc2-tsc4, energy can be shared on circuit paths 111, 115. As indicated by waveforms 206-207, at times t2b-t4b energy may first be transferred on circuit path 111 via secondary current $I_{S3}$; and subsequently shared on circuit path 115 via secondary current $I_{S3}$. According to the teachings herein, secondary controller 108 may provide control signal SEL1 to select (i.e., to close) secondary switch 125; and as illustrated, during switching periods T2-T4 control signal SEL1 transitions from low to high to close secondary switch 125.

During switching period T5 on time interval tsc5, energy can be shared on circuit paths 111, 113. As indicated by waveforms 205, 207, at time t5b energy may first be transferred on circuit path 111 via secondary current $I_{S3}$; and subsequently shared on circuit path 113 via secondary current $I_{S2}$. According to the teachings herein, secondary controller 108 may provide control signal SEL2 to select (i.e., to close) secondary switch 122; and as illustrated, during time period T5 control signal SEL2 transitions from low to high to close secondary switch 122.

As described above, the secondary controller 108 with pulse sharing control circuits 153 may use the forward pin signal FW. As illustrated by waveform 201, the forward pin signal FW transitions to a substantially constant voltage amplitude V1 during time periods tpr1-tpr5, to a substantially constant voltage amplitude V2 during time periods tsc1-tsc5, and into a variable "ringing" state during time periods trng1-trng5. As indicated above, the time periods tpr1-tpr5 beginning at times t1a-t5a, indicate when energy is provided to the primary winding 112 by primary current $I_{SW}$; and time periods tsc1-tsc5 commencing at times t1b-t5b, indicate when energy is transferring on one or more of the circuit paths 111, 113, 115. The time periods trng1-trng5 beginning at times tic-t5c are indicative of a discontinuous conduction mode (DCM) switching period; however, as also indicated above, the teachings herein are not limited to DCM and may also apply to CCM. Because the forward pin signal FW transitions to substantially constant and distinguishable voltage amplitudes V1, V2, the secondary controller 108 with pulse sharing control circuits 153 may delineate and/or distinguish a switching cycle based, at least in part, upon voltage amplitudes V1, V2.

Figure 2C:
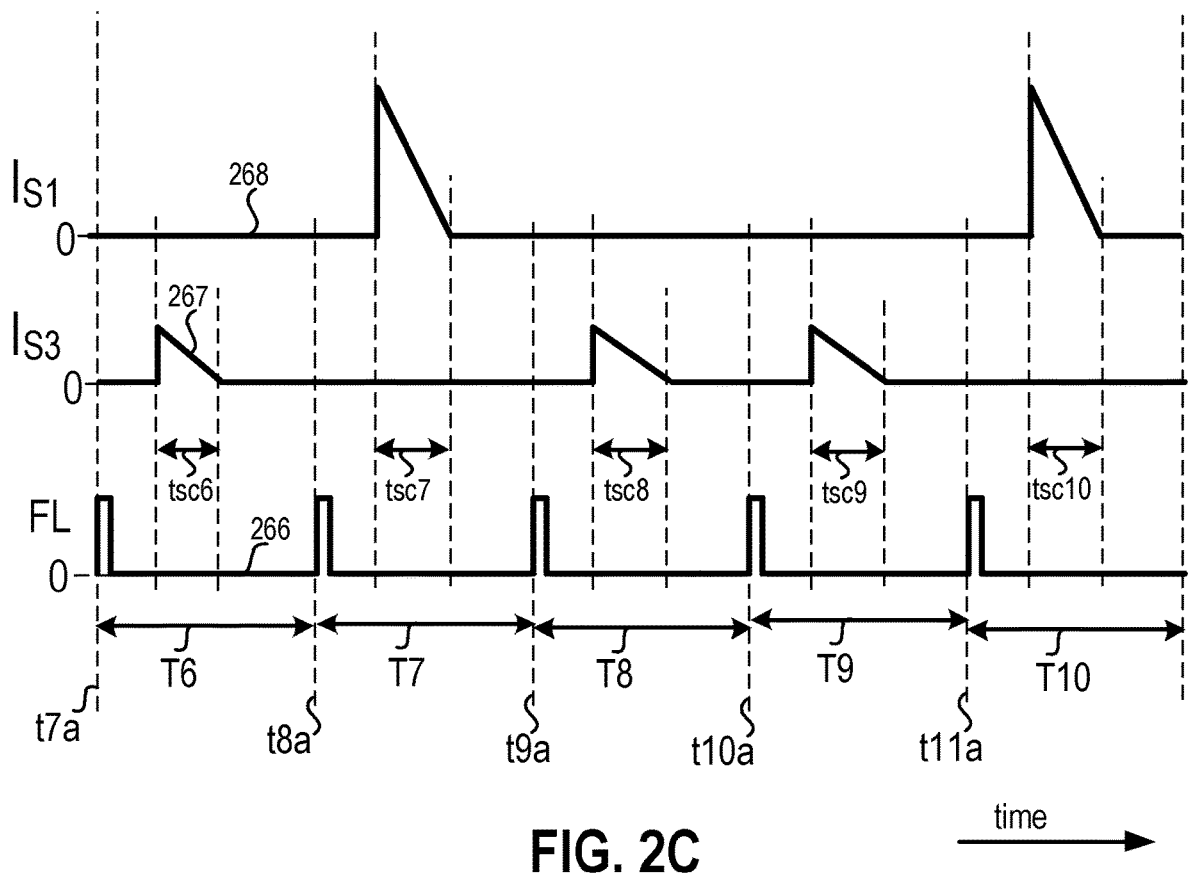
FIG. 2C illustrates waveforms during switching periods according to a single pulse transfer embodiment.

FIG. 2C illustrates waveforms 266-268 during switching periods T6-T10 according to a single pulse transfer embodiment. Waveforms 266-268 can be DCM steady state waveforms of the signal FL, secondary current $I_{S1}$, and secondary current $I_{S3}$, respectively. At times t7a-t11a the signal FL transitions from low to high communicating a request from the secondary controller 108 to the primary controller 109. In response to the signal FL, the primary controller 109 may close the primary switch 152.

The waveforms 266-268 show single pulse transfer whereby energy is transferred on a select one of the circuit paths 111, 113, 115. During switching periods T6, T8, T9 control signals SEL1, SEL2 may be provided to turn off secondary switches 125, 122. In this manner energy may be transferred just on circuit path 111 via secondary current $I_{S3}$, as illustrated by waveform 267 over time periods tsc6, tsc8, tsc9. During switching periods T7, T10 control signals SEL1, SEL2 may be provided to turn on secondary switch 125 (i.e., control signal SEL1 is high and control signal SEL2 is low). In this manner energy may be transferred just on circuit path 115 via secondary current $I_{S1}$, as illustrated by waveform 268 over time periods tsc7, tsc10.

As discussed above, a multiple output power converter system using single pulse transfer may exhibit audible noise. According to the teachings herein, a secondary controller 108 with pulse sharing control circuits 153 may be used to mitigate audible noise by implementing pulse sharing.

Figure 2D:
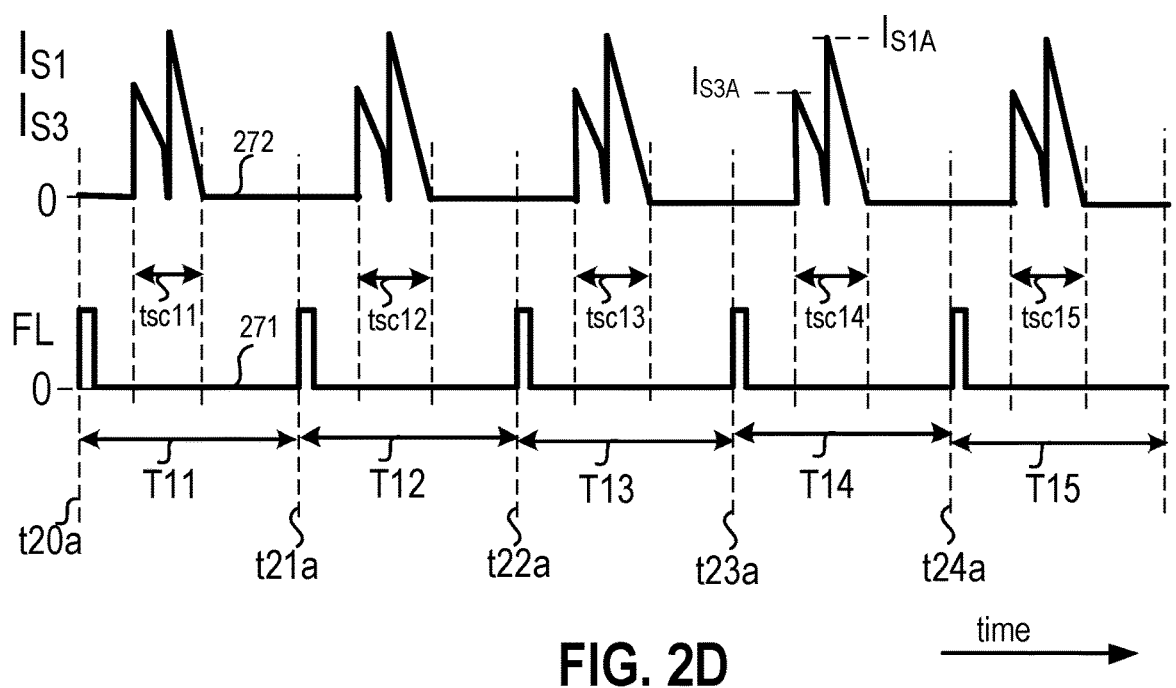
FIG. 2D illustrates waveforms during switching periods according to a pulse sharing embodiment.
Figure 2E:
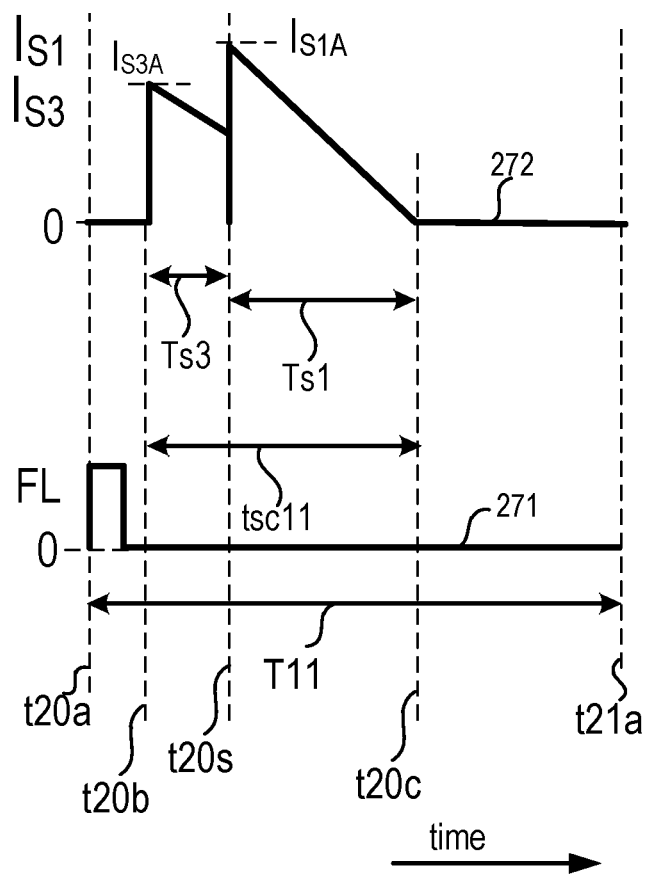
FIG. 2E illustrates a switching period of the waveforms of FIG. 2D.

FIG. 2D illustrates waveforms 271-272 during switching periods T11-T15 according to a pulse sharing embodiment; and FIG. 2E illustrates a switching period T11 of the waveforms 271-272. Waveforms 271-272 can be DCM steady state waveforms of the signal FL and of secondary current $I_{S1}$ superimposed with secondary current $I_{S3}$, respectively. At times t20a-t24a the signal FL transitions from low to high communicating a request from the secondary controller 108 to the primary controller 109. In response, the primary controller 109 may close the primary switch 152.

The waveforms 271-272 show shared pulse transfer whereby energy is transferred on one or more of circuit paths 111, 113, 115. During switching periods T11-T15 control signals SEL1, SEL2 may initially be off such that energy is first transferred on circuit path 111 via secondary current $I_{S3}$. Subsequently, control signals SEL1, SEL2 may be provided to turn on secondary switch 125 (i.e., control signal SEL1 is high and control signal SEL2 is low) during switching periods T11-T15. As seen during the time intervals tsc11-tsc15, energy may be transferred first on circuit path 111 via secondary current $I_{S3}$ and subsequently on circuit path 115 via secondary current $I_{S1}$.

With reference to FIG. 2E, the signal FL (i.e., waveform 271) may transition from low to high at time t20a communicating a request to close the primary switch 152. As shown by waveform 272, superimposing secondary current $I_{S3}$ and secondary current $I_{S1}$, the secondary current $I_{S3}$ has a pulse width Ts3 and peak current $I_{S3A}$, and the secondary current $I_{S1}$ has a pulse width Ts1 and peak current $I_{S1A}$. Pulse sharing occurs over the time interval tsc11 beginning at time t20b and ending at time t20c.

According to the teachings herein, the secondary controller 108 with pulse sharing control circuits 153 may control pulse width of one or more of the shared pulses of circuit paths 111, 113, 115 (secondary currents $I_{S1}$-$I_{S3}$). For instance, with reference to FIG. 2E, the secondary controller 108 with pulse sharing control circuits 153 may adjust the transition time t20s to vary the pulse width Ts3 and pulse with Ts1.

Figure 2F:
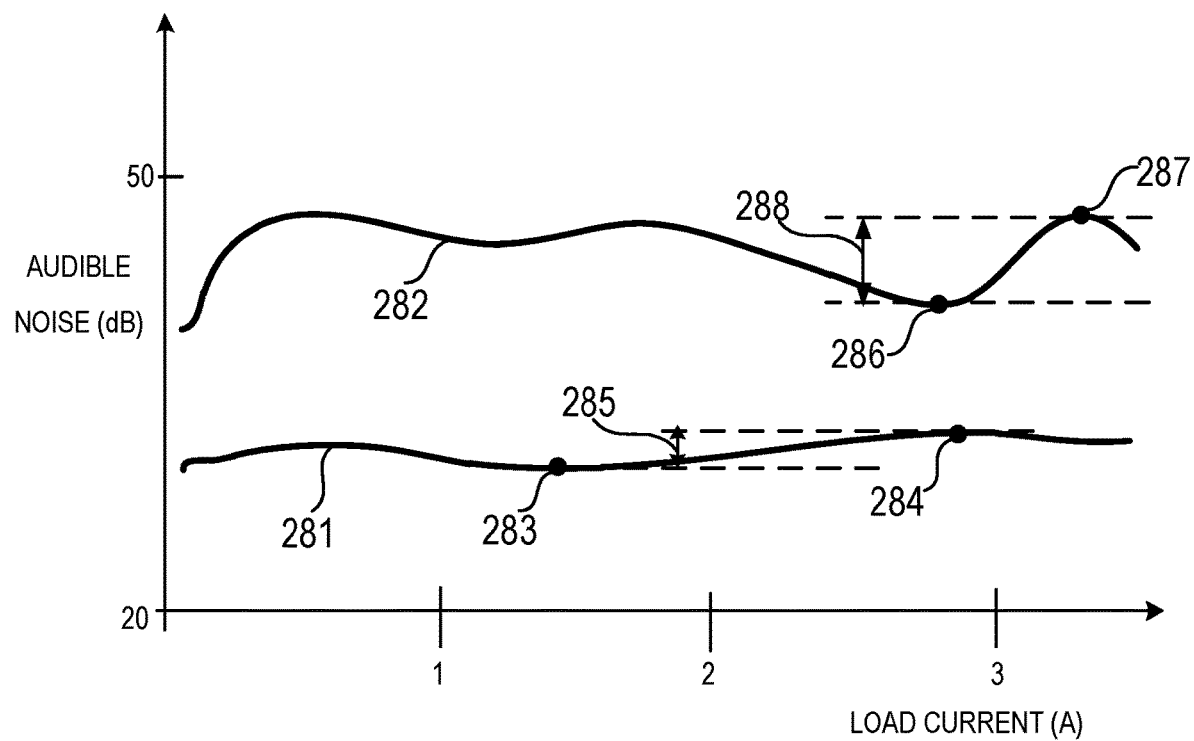
FIG. 2F illustrates graphs of audible noise versus load current.

As discussed herein, pulse sharing transfer may advantageously reduce audible noise by increasing a subharmonic frequency and/or moving a subharmonic frequency above the audible band. For instance, FIG. 2F illustrates graphs 281-282 of audible noise in decibels (dB) versus load current. Graph 282 may correspond with the embodiment of FIG. 2C using single pulse transfer while graph 281 may correspond with the embodiment of FIG. 2D using shared pulse transfer. As illustrated when pulse sharing is implemented, both audible noise and audible noise variation (sensitivity) as a function of load current are improved (reduced). For instance, the local maximum 284, local minimum 283, and variation 285 of graph 281, corresponding with shared pulse transfer, are respectively reduced (i.e., improved) relative to the local maximum 287, local minimum 286, and variation 288 of graph 282, corresponding with single pulse transfer. Pulse sharing transfer may also improve converter efficiency by reducing loss due to root mean square current. For instance, with reference to FIG. 2E, as the pulse widths Ts1, Ts3 are varied to increase subharmonic frequency, the peak currents $I_{S1A}$, $I_{S3A}$ and root mean square of secondary current $I_{S1}$ and/or of secondary current $I_{S3}$ may be reduced.

Although FIG. 2B-FIG. 2E illustrate pulse sharing whereby energy may be transferred first on circuit path 111 via secondary current $I_{S3}$, (see, e.g., time intervals tsc11-tsc15), other pulse sharing permutations are possible.

Figure 2G:
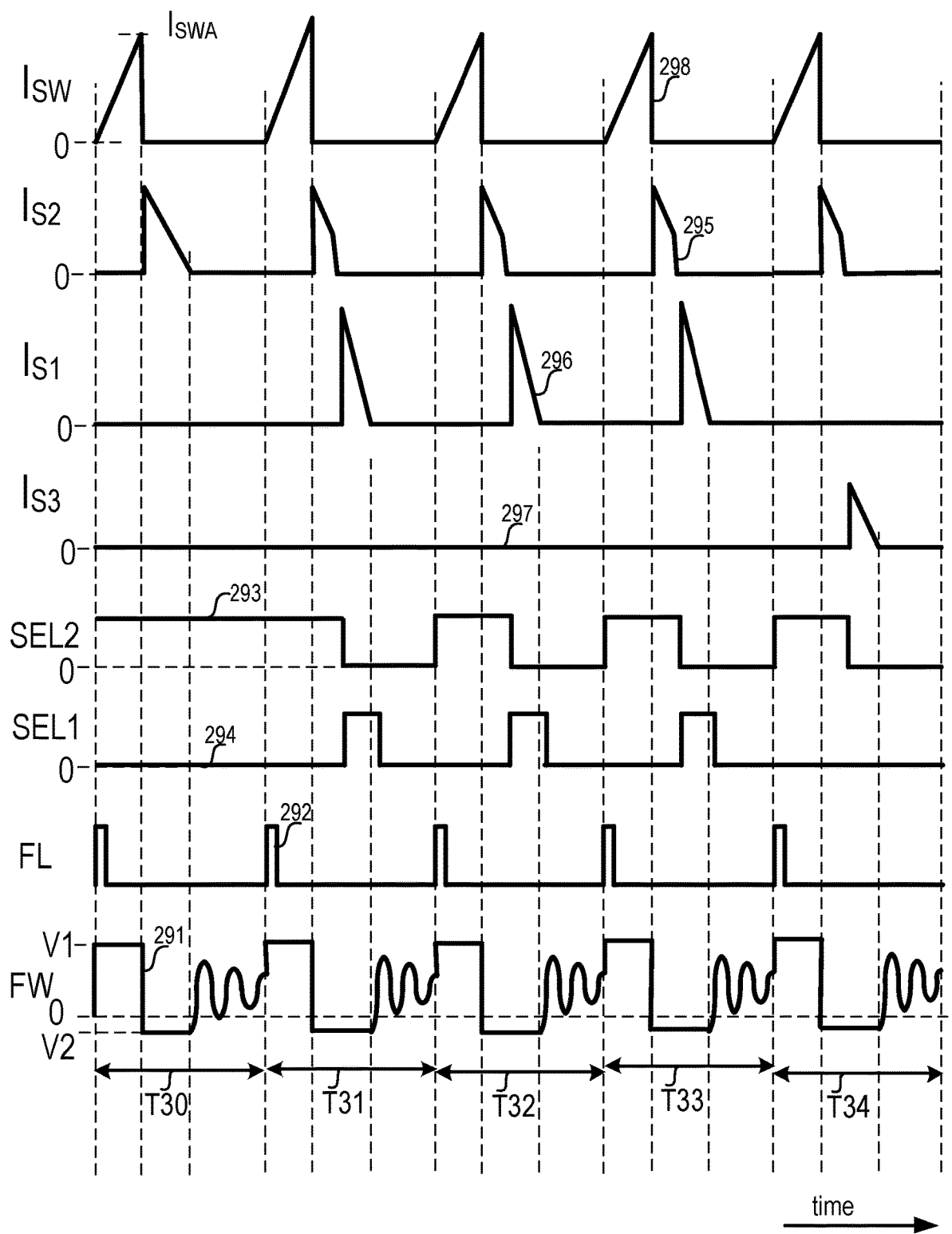
FIG. 2G illustrates waveforms during switching periods according to another pulse sharing embodiment.

For instance, FIG. 2G illustrates waveforms 291-298 during switching periods T30-T34 according to another pulse sharing embodiment. Waveforms 291-298 can be DCM steady state waveforms of the forward pin signal FW, signal FL, control signal SEL2, control signal SEL1, secondary current $I_{S2}$, secondary current $I_{S1}$, secondary current $I_{S3}$, and primary current $I_{SW}$, respectively. Waveforms 291-298 are similar to waveforms 201-208, except during switching periods T30-T34 energy may be transferred first on circuit path 113 via secondary current $I_{S2}$.

During switching periods T31-T33 energy can be shared on circuit paths 113, 115. As indicated by waveforms 295-297, energy may be first transferred on circuit path 113 via secondary current $I_{S2}$; and subsequently shared on circuit path 115 via secondary current $I_{S1}$. As illustrated by waveforms 293, 294, when control signal SEL2 is exerted high (control signal SEL1 exerted low), secondary switch 122 conducts and energy may be transferred on circuit path 113 via secondary current $I_{S2}$. Similarly, when control signal SEL1 is exerted high (control signal SEL2 exerted low), secondary switch 125 conducts and energy may transferred on circuit path 115 via secondary current $I_{S1}$.

During switching period T34 energy can be shared on circuit paths 113, 111. As indicated by waveforms 295-297, energy may be first transferred on circuit path 113 via secondary current $I_{S2}$; and subsequently shared on circuit path 111 via secondary current $I_{S3}$. As illustrated by waveforms 293, 294, when control signal SEL2 is exerted high (control signal SEL1 exerted low), secondary switch 122 conducts and energy may be transferred on circuit path 113 via secondary current $I_{S2}$. Subsequently, when both control signals SEL1, SEL2 are exerted low, secondary switches 122, 125 block current flow. Accordingly, diode 120 may conduct (i.e., be forward biased) and energy may be transferred on circuit path 111 via secondary current $I_{S3}$.

Although FIG. 2B through FIG. 2G illustrate pulse sharing whereby energy may be transferred first on one circuit path and then in another circuit path, it is recognized that other pulse sharing permutations are possible such as for example pulse sharing between more than two circuit paths during a single switching cycle.

Figure 3:
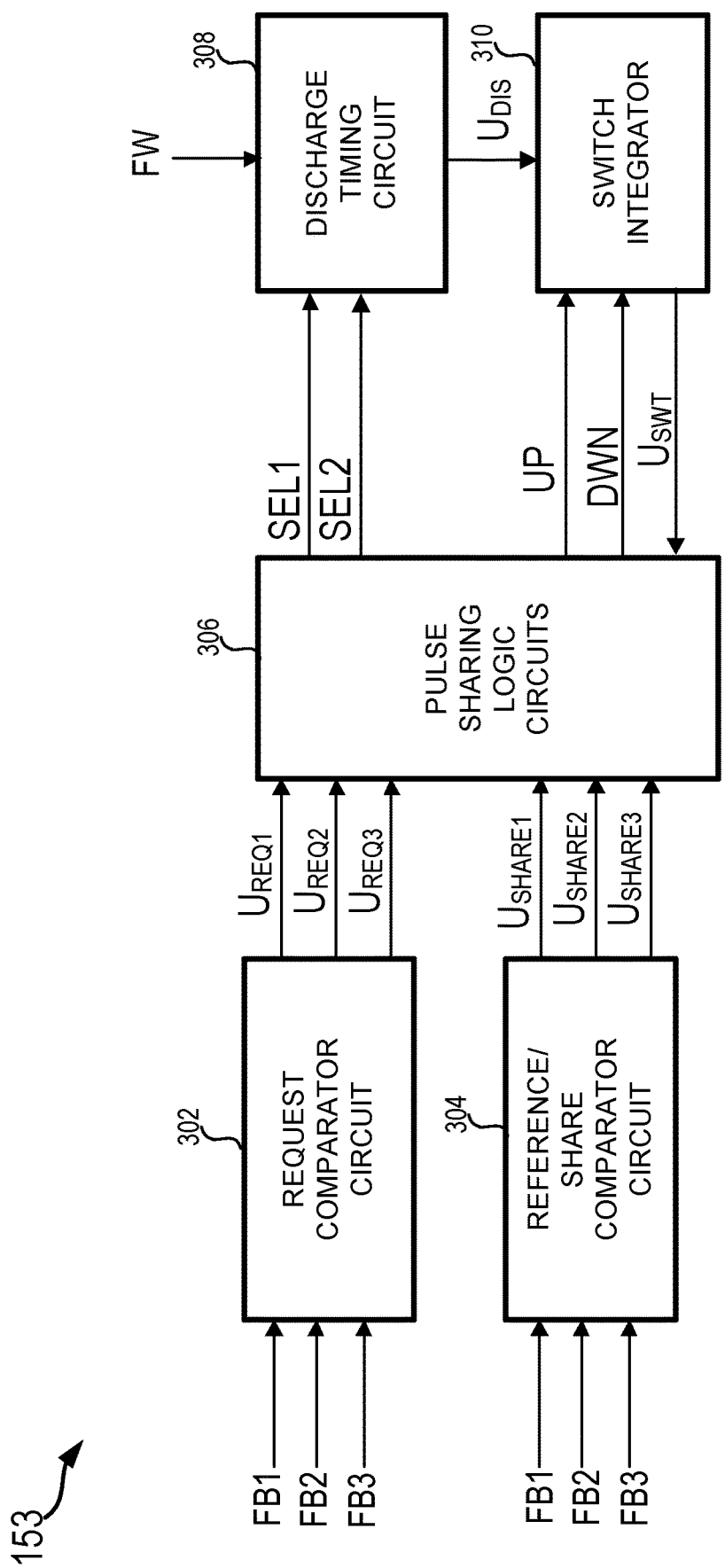
FIG. 3 illustrates pulse sharing control circuits according to an embodiment.

FIG. 3 illustrates pulse sharing control circuits 153 according to an embodiment. The pulse sharing control circuits 153 include a request comparator circuit 302, a reference/share comparator circuit 304, pulse sharing logic circuits 306, a discharge timing circuit 308, and a switch integrator 310. Request comparator circuit 302 receives feedback signals FB1-FB3 and provides logic signals $U_{REQ1}$-$U_{REQ3}$ to pulse sharing logic circuits 306. Reference/share comparator circuit 304 receives feedback signals FB1-FB3 and provides logic signals $U_{SHARE1}$-$U_{SHARE3}$ to the pulse sharing logic circuits 306. Discharge timing circuit 308 receives the forward pin signal FW, and provides logic signal $U_{DIS}$ to the switch integrator 310; and switch integrator 310 receives logic signals UP, DWN from the pulse sharing logic circuits 306. The pulse sharing logic circuits 306 may generate the control signals SEL1, SEL2 and also provide the control signals SEL1, SEL2 to the discharge timing circuit 308.

As discussed above the secondary controller 108 with pulse sharing control circuits 153 may adjust a switch transition time (e.g., transition time t205) to vary the pulse width (e.g., pulse widths Ts1, Ts3). The discharge timing circuit 308 may use the forward pin signal FW to delineate when energy is being transferred to the secondary windings 114, 116, 118. For instance, the discharge timing circuit 308 may, provide logic signal $U_{DIS}$ in response to delineating a DCM switching cycle based, at least in part, upon voltage amplitudes V1, V2 of waveform 201. The switch over transition time SWT (e.g., transition time t205) may be determined, at least in part, by logic signals UP, DWN, and $U_{SWT}$. For instance, logic signal UP may be used to increase and/or increment switch over transition time SWT while logic signal DWN may be used to decrease and/or decrement switch over transition time SWT.

Additionally, the secondary controller 108 with pulse sharing control circuits 153 may determine when to share pulses based, at least in part, on the demand (e.g., power demand) of the multiple loads 106. In this regard the request comparator circuit 302 and the reference/share comparator circuit 304 may respectively provide logic signals $U_{REQ1}$-$U_{REQ3}$ and logic signals $U_{SHARE1}$-$U_{SHARE3}$ to indicate demand from the multiple loads 106. The pulse sharing logic circuits 306 may, in turn, generate control signals SEL1, SEL2 as a function of the logic signals $U_{REQ1}$-$U_{REQ3}$ and logic signals $U_{SHARE1}$-$U_{SHARE3}$. For instance, FIG. 4A and FIG. 4B describe a request comparator circuit 302 and reference/share comparator circuit 304 which respectively provide logic signals $U_{REQ1}$-$U_{REQ3}$ and logic signals $U_{SHARE1}$-$U_{SHARE3}$ based, at least in part, upon the feedback signals FB1-FB3 and offset (e.g., five to one-hundred millivolts of offset).

Figure 4A:
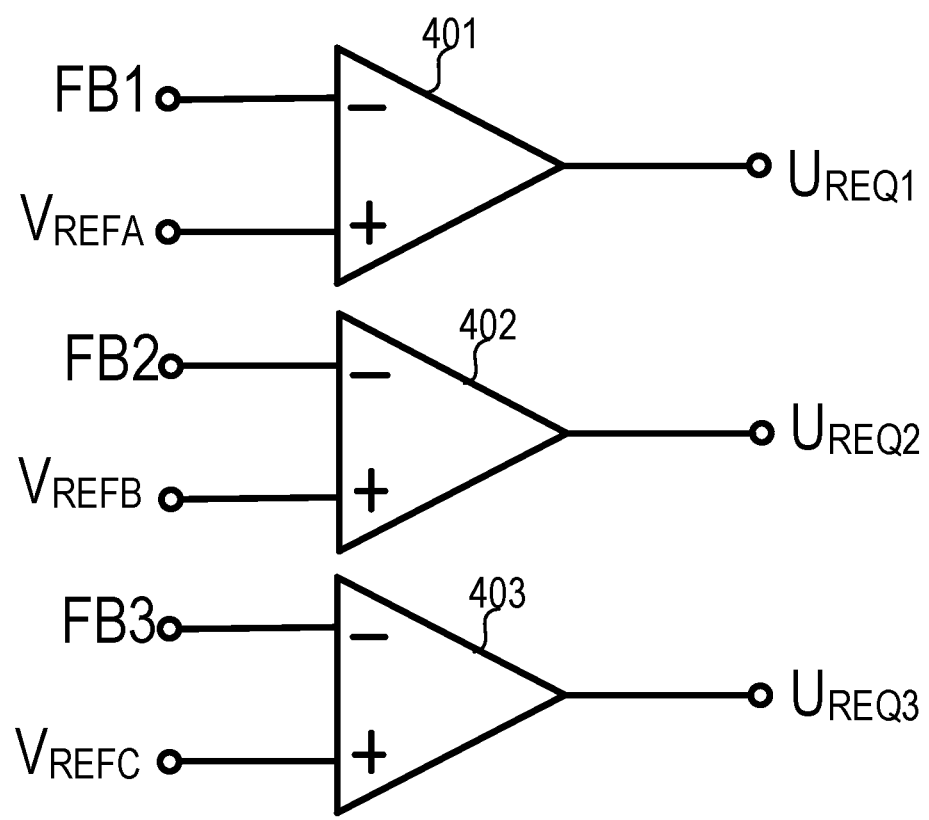
FIG. 4A illustrates a request comparator circuit according to an embodiment.

FIG. 4A illustrates a request comparator circuit 302 according to an embodiment. The request comparator circuit 302 comprises comparators 401-403 which respectively provide logic signals $U_{REQ1}$-$U_{REQ3}$ in response to analog signal comparisons. Comparator 401 receives feedback signal FB1 at an inverting terminal, and compares feedback signal FB1 to a reference voltage $V_{REFA}$ at a noninverting terminal. Comparator 402 receives feedback signal FB2 at an inverting terminal, and compares feedback signal FB2 to a reference voltage $V_{REFB}$ at a noninverting terminal. Comparator 403 receives feedback signal FB3 at an inverting terminal, and compares feedback signal FB3 to a reference voltage $V_{REFC}$ at a noninverting terminal. In one embodiment request information communicated by the signal FL, (e.g., waveform 202) may be determined, at least in part, by logic signals $U_{REQ1}$-$U_{REQ3}$. For instance, immediately prior to switching period T31 in FIG. 2G, logic signal $U_{REQ2}$ may be exerted high in response to feedback signal FB2 dropping below reference voltage $V_{REFB}$. Accordingly, during switching period T31, waveform 292 of signal FL indicates a request based, at least in part, on logic signal $U_{REQ2}$.

Figure 4B:
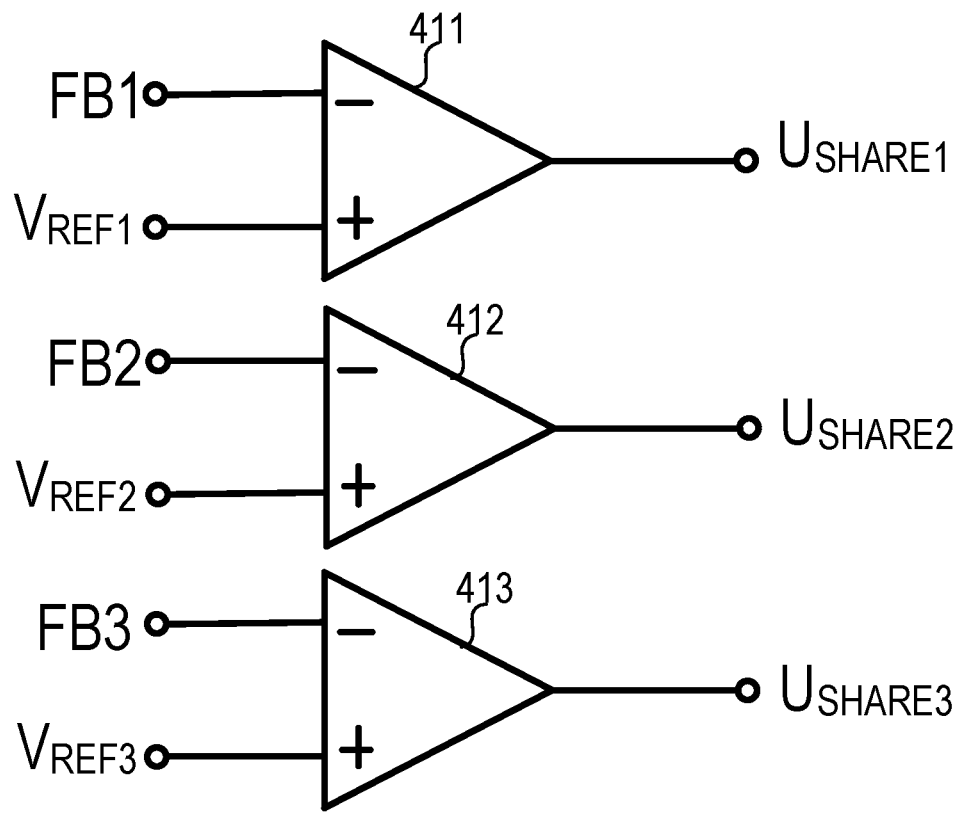
FIG. 4B illustrates a reference/share comparator circuit according to an embodiment.

FIG. 4B illustrates a reference/share comparator circuit 304 according to an embodiment. The reference/share comparator circuit 304 comprises comparators 411-413 which respectively provide logic signals $U_{SHARE1}$-$U_{SHARE3}$ in response to analog signal comparisons. Comparator 411 receives feedback signal FB1 at an inverting terminal, and compares feedback signal FB1 to a reference voltage $V_{REF1}$ at a noninverting terminal. Comparator 412 receives feedback signal FB2 at an inverting terminal, and compares feedback signal FB2 to a reference voltage $V_{REF2}$ at a noninverting terminal. Comparator 413 receives feedback signal FB3 at an inverting terminal, and compares feedback signal FB3 to a reference voltage $V_{REF3}$ at a noninverting terminal.

Analog reference voltage $V_{REF1}$ may be determined by the sum of the reference voltage $V_{REFA}$ (e.g., one point two volts) plus a first offset $V_{OS1}$ (e.g., five to one-hundred millivolts). Reference voltage $V_{REF2}$ may be determined by the reference voltage $V_{REFB}$ plus a second offset $V_{OS2}$ (e.g., five to one-hundred millivolts); and reference voltage $V_{REF3}$ may be determined by the reference voltage $V_{REFC}$ plus a third offset Voss (e.g., five to one-hundred millivolts). In one embodiment, the reference voltage $V_{REF3}$ can be a reference relating to providing CC and/or CV regulation of the CC/CV3 port of multiple loads 106 while reference voltages $V_{REF1}$ and $V_{REF2}$ may be references relating to respectively providing CV regulation of the CC/CV1 port and the CC/CV2 port of multiple loads 106.

As discussed above, the pulse sharing logic circuits 306 may determine when to share pulses. Additionally, the pulse sharing logic circuits 306 may determine when to share pulses as a function of the first offset $V_{OS1}$, second offset $V_{OS2}$, and third offset Voss. For instance, during switching period T31 of FIG. 2G, the condition to share energy on circuit path 115 via secondary current $I_{S1}$ may be based on both logic signal $U_{SHARE1}$ and logic signal $U_{REQ1}$. During switching period T31, logic signal $U_{SHARE1}$ may be exerted high in response to feedback signal FB1 dropping below reference voltage $V_{REF1}$, Concurrently logic signal $U_{REQ1}$ may remain low indicating the feedback signal FB1 is greater than reference voltage $V_{REFA}$ by no more than the first offset $V_{OS1}$.

Figure 5:
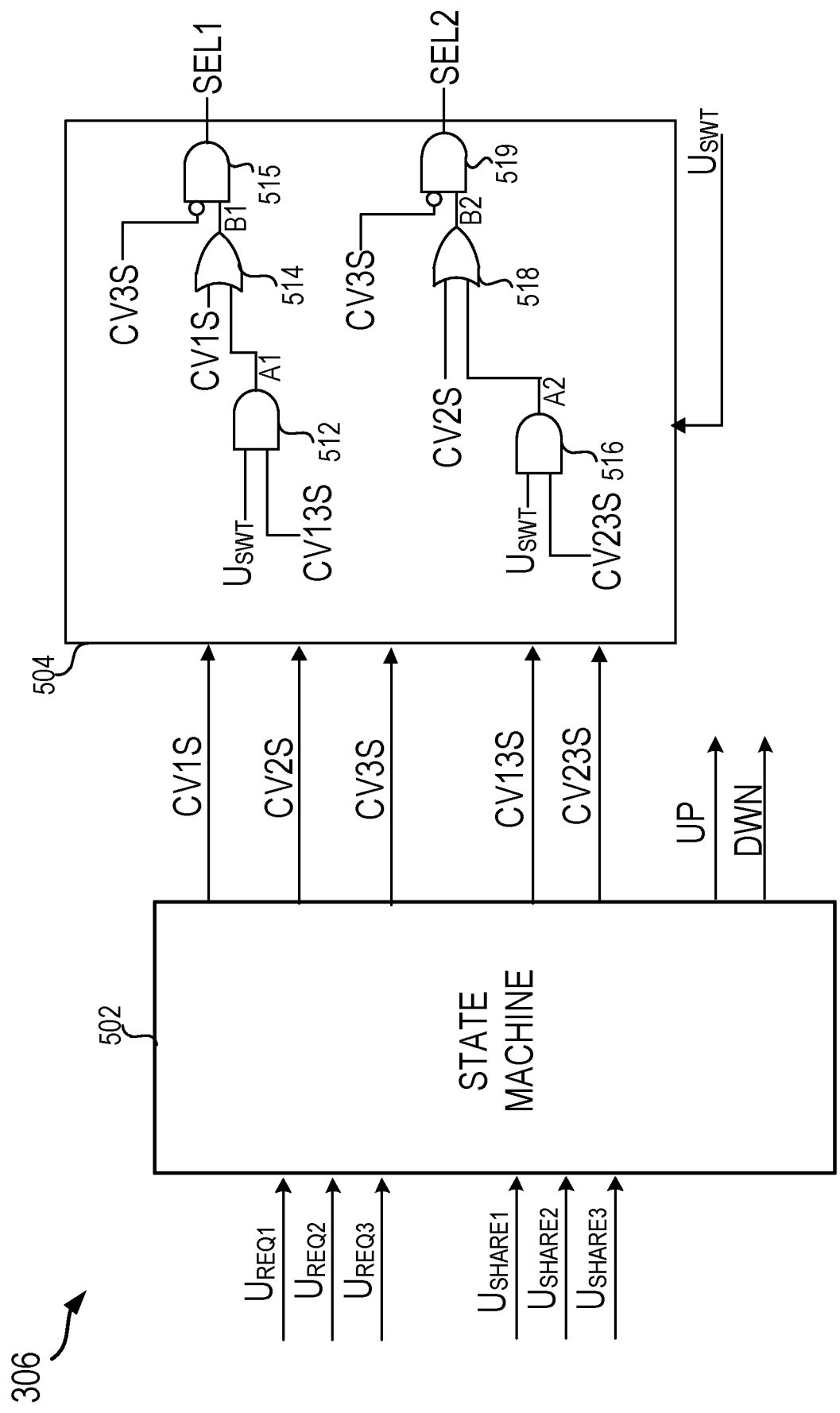
FIG. 5 illustrates pulse sharing logic circuits according to an embodiment.

FIG. 5 illustrates pulse sharing logic circuits 306 according to an embodiment. Pulse sharing logic circuits 306 include a state machine 502 and combinatorial logic 504. State machine 502 receives logic signals $U_{REQ1}$-$U_{REQ3}$, logic signals $U_{SHARE1}$-$U_{SHARE3}$, and provides logic signals UP, DWN, CV1S, CV2S, CV3S, CV13S, CV23S.

In one embodiment the state machine 502 may generate logic signals CV1S, CV2S, CV3S, CV13S, CV23S using a pulse sharing algorithm (see, e.g., pulse sharing algorithm 600 below).

Logic signals CV1S, CV2S, CV3S, CV13S, CV23S may determine, at least in part, how energy is transferred during a switching period. For instance, logic signals CV1S, CV2S, and CV3S may be "FULL PULSE" logic signals to force single pulse control (i.e., "FULL PULSE" control). As described above, during single pulse control, energy is transferred just on a select one of circuit paths 111, 113, or 115; and a circuit path 111, 113, or 115 may be selected during a switching period by control of secondary switches 122, 125. Alternatively and additionally, logic signals CV13S, CV23S may be "SHARED PULSE" logic signals to avail pulse sharing during a switching period. For instance, logic signal CV13S may be a logic signal to cause energy to be shared on circuit path 111 via secondary current $I_{S3}$ and on circuit path 115 via secondary current $I_{S1}$. Logic signal CV23S may be a logic signal to cause energy to be shared on circuit path 111 via secondary current $I_{S3}$ and on circuit path 113 via secondary current $I_{S2}$.

Combinatorial logic 504 receives logic signals CV1S, CV2S, CV3S, CV13S, CV23S, logic signal $U_{SWT}$, and provides the control signals SEL1, SEL2.

Combinatorial logic 504 includes AND gates 512, 515, 516, 519, and OR gates 514, 518. As logically illustrated by the logic of AND gate 512, OR gate 514 and AND gate 515, control signal SEL1 can be the logical AND of the inverse (NOT) of logic signal CV3S with logic signal B1. Logic signal B1 can be the logical OR of logic signal CV with logic signal A1; and logic signal A1 can be the logical AND of logic signal $U_{SWT}$ with logic signal CV13S. Similarly, as logically illustrated by the connections of AND gate 516, OR gate 518, and AND gate 519, control signal SEL2 can be the logical AND of the inverse (NOT) of logic signal CV3S with logic signal B2. Logic signal B2 can be the logical OR of logic signal CV2S with logic signal A2; and logic signal A2 can be the logical AND of logic signal $U_{SWT}$ with logic signal CV13S.

Figure 6A:
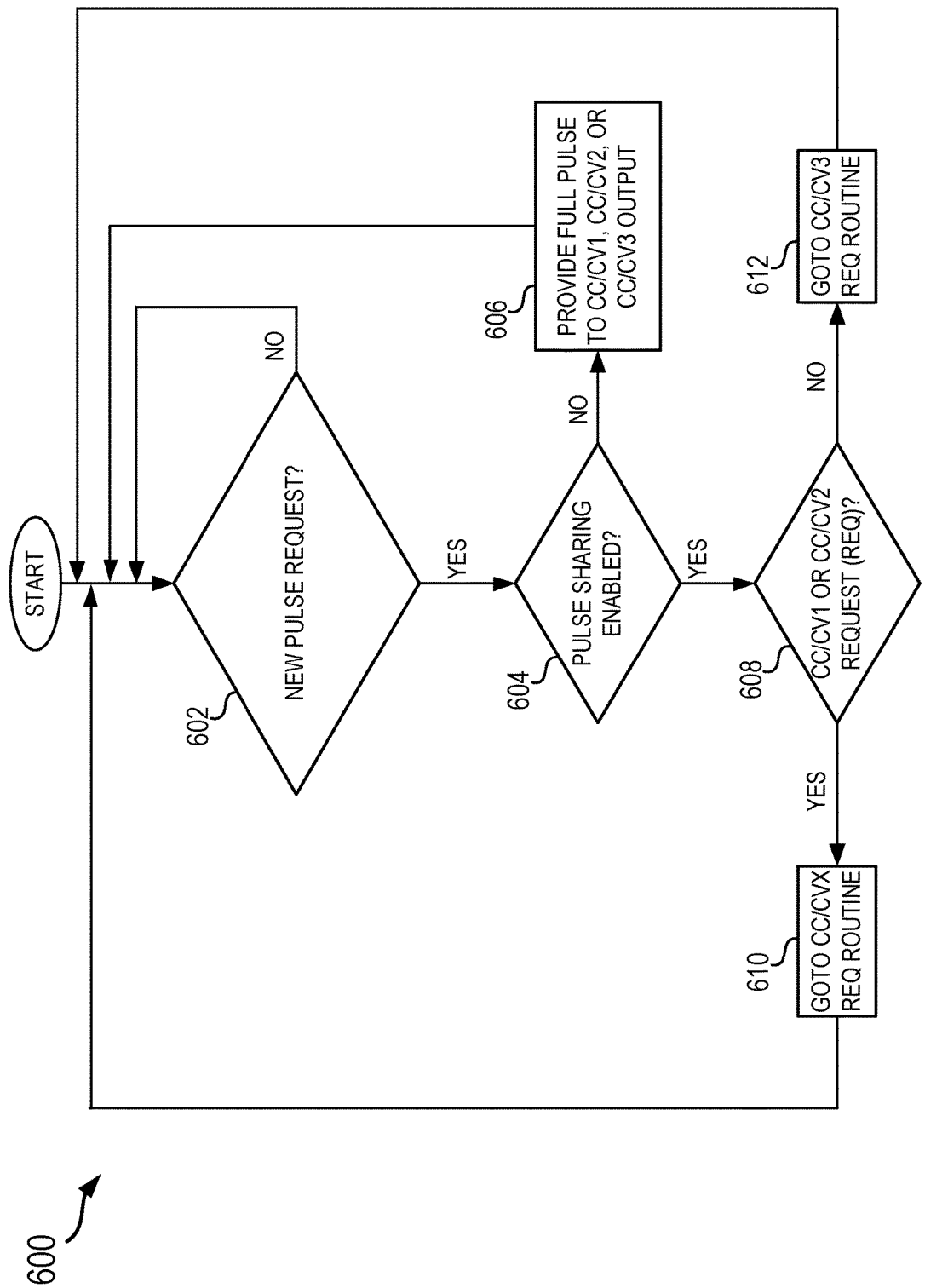
FIG. 6A illustrates a flow chart for a pulse sharing algorithm during a switching cycle according to an embodiment.

FIG. 6A illustrates a flow chart for a pulse sharing algorithm 600 during a switching cycle according to an embodiment. The pulse sharing algorithm begins with decision step 602 corresponding with the need for energy. For instance, if the CC/CV1 port or CC/CV2 port of the multiple loads 106 drops below its regulation voltage, then there may be a need for more energy. Alternatively, if the CC/CV3 port requires more energy to provide regulated load current $I_{L3}$, then there may be a demand. The demand for more energy would correspond with "YES" whereby the pulse sharing algorithm may proceed to a subsequent decision step 604. Alternatively, "NO" indicates remain at decision step 602 (i.e., repeat decision step 602).

The next decision step 604 determines if multiple output power converter system 100 has enabled pulse sharing. If the condition is false (i.e., determines "NO"), then a "FULL PULSE" condition (i.e., single pulse control) exists and the pulse sharing algorithm 600 proceeds to step 606. Step 606 corresponds to operating with single pulse control. For instance, logic signals CV1S, CV2S, and/or CV3S may be exerted so that control signals SEL1, SEL2 allow for energy transfer on just one of circuit paths 111, 113, or 115 during a switching period (e.g., any one of switching periods T6-T10). Upon completion of step 606, the switching algorithm returns to decision step 602.

If the condition at decision step 606 is true (i.e., determines "YES"), then the pulse sharing algorithm 600 proceeds to decision step 608.

The next decision step 608 determines the condition for energy demand from either the CC/CV1 port or the CC/CV2 port of multiple loads 106. For instance, if comparator 401 changes state (i.e., logic signal $U_{IQ1}$ changes state) to indicate the output voltage $V_{O1}$ is out of regulation, then the condition at decision step 608 is true (i.e., determines "YES"). Or, if comparator 402 changes state (i.e., logic signal $U_{REQ2}$ changes state) to indicate the output voltage $V_{O2}$ is out of regulation, then the condition at decision step 608 is true (i.e., determines "YES").

If the condition at decision step 608 is true (i.e., determines "YES"), then the pulse sharing algorithm 600 proceeds to subroutine 610; otherwise, the pulse sharing algorithm 600 proceeds to subroutine 612. The pulse sharing algorithm 600 may use subroutine 610 to determine how to provide energy to either the CC/CV1 port or CC/CV2 port of multiple loads 106 and if the energy may be shared with the CC/CV3 port. Alternatively, the pulse sharing algorithm 600 may use subroutine 612 to determine how energy may be provided to the CC/CV3 port of multiple loads 106 and if the energy may be shared with either the CC/CV1 port or CC/CV2 port.

Figure 6B:
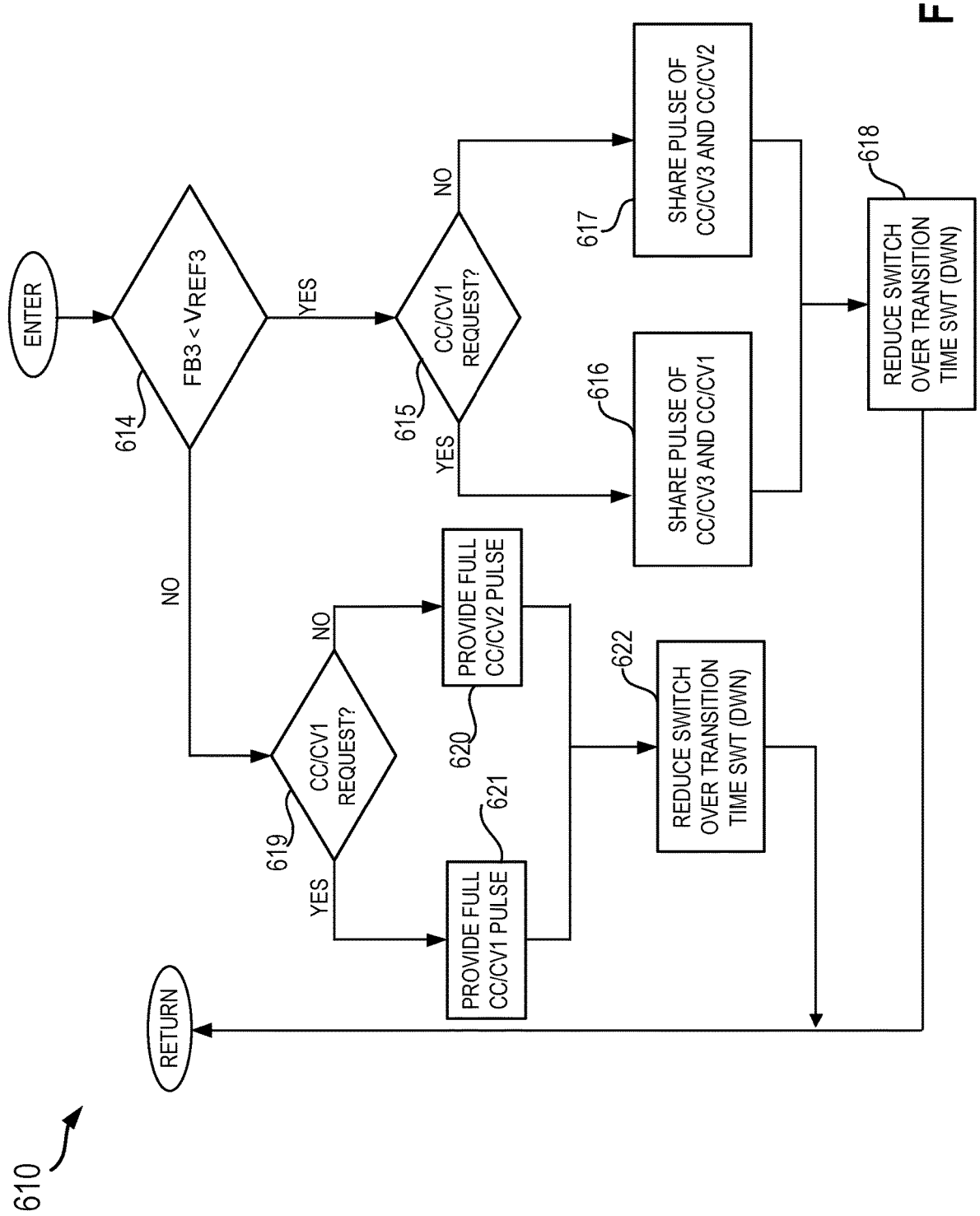
FIG. 6B illustrates a subroutine according to the flow chart of FIG. 6A.

FIG. 6B illustrates a subroutine 610 according to the flow chart of FIG. 6A. Upon entry the subroutine 610 proceeds to decision step 614. Decision step 614 compares feedback signal FB3 to reference voltage $V_{REF3}$ (see, e.g., comparator 413). If the result (e.g., logic signal $U_{SHARE3}$), is true (i.e., determines "YES") then the subroutine 610 proceeds to decision step 615. If the result of decision step 614 is false (i.e., determines "NO"), then the subroutine 610 proceeds to decision step 619.

Decision step 615 determines the energy demand from the CC/CV1 port of the multiple loads 106 to determine if the CC/CV1 port should receive energy or if the CC/CV2 port should receive energy. For instance, if comparator 401 changes state (i.e., logic signal $U_{REQ1}$ changes state) to indicate the output voltage $V_{O1}$ is out of regulation, then the condition at decision step 615 is true (i.e., determines "YES"). If the condition at step 615 is true, then subroutine 610 proceeds to step 616; otherwise, subroutine 610 proceeds to step 617.

Step 616 may correspond with sharing energy to both the CC/CV3 port of the multiple loads 106 and the CC/CV1 port. The control signal SEL1 may be provided to the secondary switches block 104 to close secondary switch 125 so that some energy first transfers on circuit path 111 via secondary current $I_{S3}$, and subsequently on circuit path 115 via secondary current $I_{S1}$ (see, e.g., switching periods T2-T4).

Step 617 may correspond with sharing energy to both the CC/CV3 port of the multiple loads 106 and the CC/CV2 port. The control signal SEL2 may be provided to the secondary switches block 104 to close secondary switch 122 so that some energy first transfers on circuit path 111 via secondary current $I_{S3}$, and subsequently on circuit path 113 via secondary current $I_{S2}$ (see, e.g., switching period T5).

Following step 616 and following step 617, subroutine 610 proceeds to step 618. During step 618 the subroutine 610 may adjust (e.g., may reduce) the switch over transition time SWT in the digital and/or analog domain. The switch over transition time SWT may be a switch over time such as the transition time t20s which may, in turn, be decreased so as to decrease pulse width Ts3 (see, e.g., FIG. 2E). Following step 618, subroutine 610 returns to decision step 602 of the pulse sharing algorithm 600.

Decision step 619 determines the energy demand from the CC/CV1 port of the multiple loads 106 to determine if the CC/CV1 port should receive energy or if the CC/CV2 port should receive energy. For instance, if comparator 401 changes state (i.e., logic signal $U_{REQ1}$ changes state) to indicate the output voltage $V_{O1}$ is out of regulation, then the condition at decision step 619 is true (i.e., determines "YES"). If the condition at step 619 is true, then subroutine 610 proceeds to step 621; otherwise, subroutine 610 proceeds to step 620.

Step 621 may correspond with providing a full pulse to the CC/CV1 port of multiple loads 106. For instance, energy may be transferred just on circuit path 115 via secondary current $I_{S1}$. The control signal SEL1 may be provided to the secondary switches block 104 to close secondary switch 125 during a switching period (see, e.g., switching period T7).

Step 620 may correspond with providing a full pulse to the CC/CV2 port of multiple loads 106. For instance, energy may be transferred just on circuit path 113 via secondary current $I_{S2}$. The control signal SEL2 may be provided to the secondary switches block 104 to close secondary switch 122 during a switching period.

Following step 620 and following step 621, subroutine 610 proceeds to step 622. Step 622 may be similar to step 618; however, the subroutine 610 may adjust (e.g., may reduce) the switch over transition time SWT by a larger amount in accordance with the condition of decision step 614. Namely, the feedback signal FB3 is greater than or equal to the reference voltage $V_{REF3}$. Following step 622, the subroutine 610 returns to decision step 602 of the pulse sharing algorithm 600.

Figure 6C:
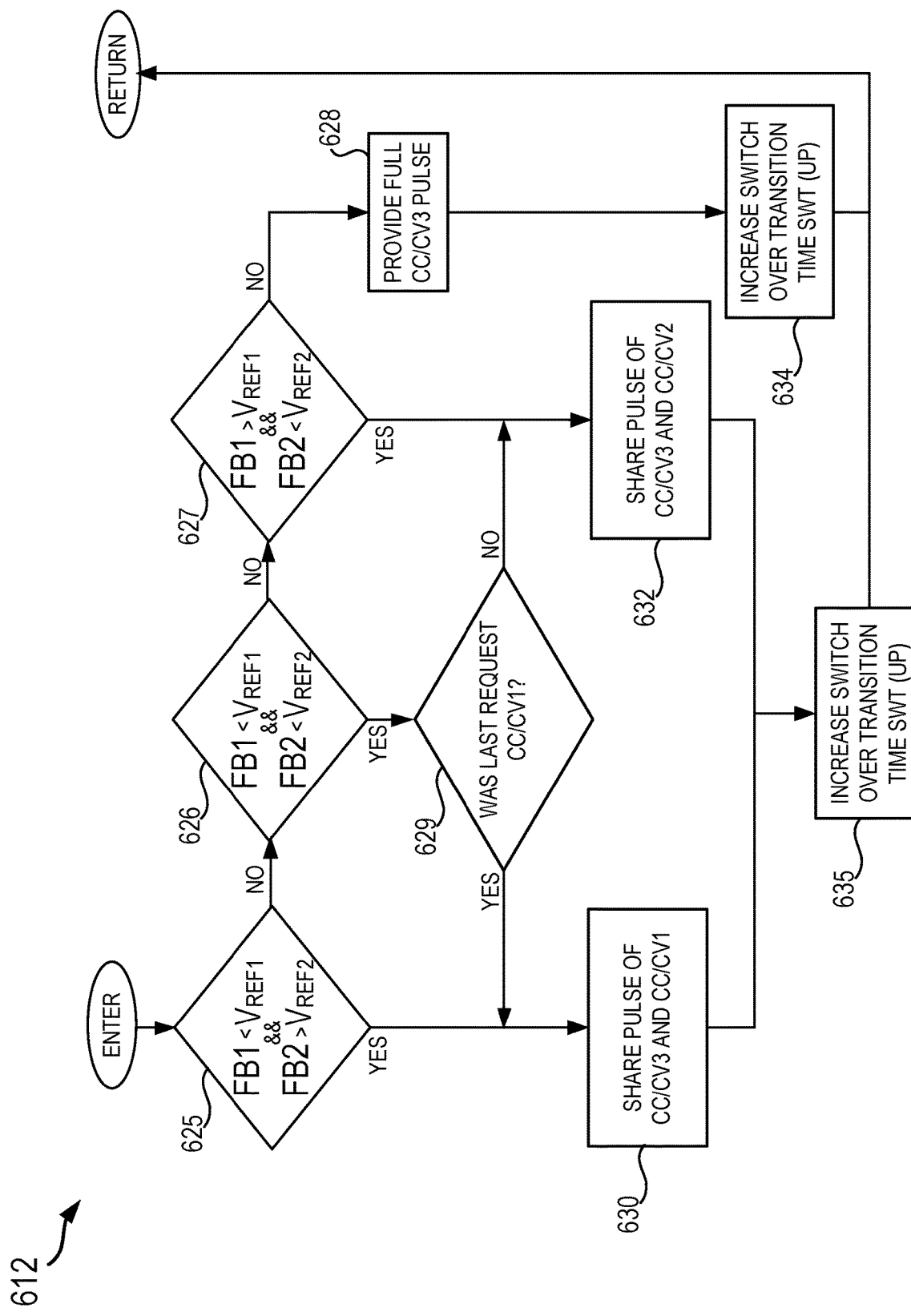
FIG. 6C illustrates a subroutine according to the flow chart of FIG. 6A.

FIG. 6C illustrates a subroutine 612 according to the flow chart of FIG. 6A. Upon entry the subroutine 612 proceeds to decision step 625. Decision step 625 compares feedback signal FB1 to reference voltage $V_{REF1}$ (see, e.g., comparator 411) and compares feedback signal FB2 to reference voltage $V_{REF2}$ (see, e.g., comparator 412). The condition of decision step 625 may correspond with the CC/CV1 port of multiple loads 106 demanding energy and the CC/CV2 port not demanding energy. If the condition of decision step 625 is true, then subroutine 612 proceeds to step 630, which may be functionally equivalent to step 616 of subroutine 610. Otherwise, subroutine 612 proceeds to decision step 626.

Decision step 626 compares feedback signal FB1 to reference voltage $V_{REF1}$ (see, e.g., comparator 411) and compares feedback signal FB2 to reference voltage $V_{REF2}$ (see, e.g., comparator 412). The condition of decision step 626 may correspond with the CC/CV1 port of multiple loads 106 demanding energy and the CC/CV2 port demanding energy. If the condition of decision step 626 is true, then subroutine 612 proceeds to decision step 629; otherwise, subroutine 612 proceeds to decision step 627.

Decision step 629 determines if the preceding request provides energy to the CC/CV1 port of the multiple loads 106. If the condition of decision step 629 is true, then subroutine 612 proceeds to step 630; otherwise, subroutine 612 proceeds to step 632.

Decision step 627 compares feedback signal FB1 to reference voltage $V_{REF1}$ (see, e.g., comparator 411) and compares feedback signal FB2 to reference voltage $V_{REF2}$ (see, e.g., comparator 412). The condition of decision step 627 may correspond with the CC/CV1 port of multiple loads 106 not demanding energy and the CC/CV2 port demanding energy. If the condition of decision step 627 is true, then subroutine 612 proceeds to step 632, which may be functionally equivalent to step 617 of subroutine 610. Otherwise, subroutine 612 proceeds to decision step 628.

Step 628 may correspond with providing a full pulse to the CC/CV3 port of multiple loads 106. For instance, energy may be transferred just on circuit path 111 via secondary current $I_{S3}$. The control signals SEL1, SEL2 may be provided to the secondary switches block 104 to open both secondary switches 122, 125 during a switching period (see, e.g., switching periods T6, T8, T9).

Following step 630 and following step 632, subroutine 610 proceeds to step 635. During step 635 the subroutine 612 may adjust (e.g., may increase) the switch over transition time SWT in the digital and/or analog domain. The switch over transition time SWT may be a switch over time such as the transition time t20s which may, in turn, be increased so as to increase pulse width Ts3. Following step 635, subroutine 612 returns to decision step 602 of the pulse sharing algorithm 600.

Following step 628, subroutine 612 proceeds to step 634. Step 634 may be similar to step 635; however, the subroutine 612 may adjust (e.g., may increase) the switch over transition time SWT by a larger amount in accordance with the conditions of decision steps 625-627. Namely, the demand of step 628 to provide a full pulse to the CC/CV3 port. Following step 634, the subroutine 612 returns to decision step 602 of the pulse sharing algorithm 600.

Figure 7:
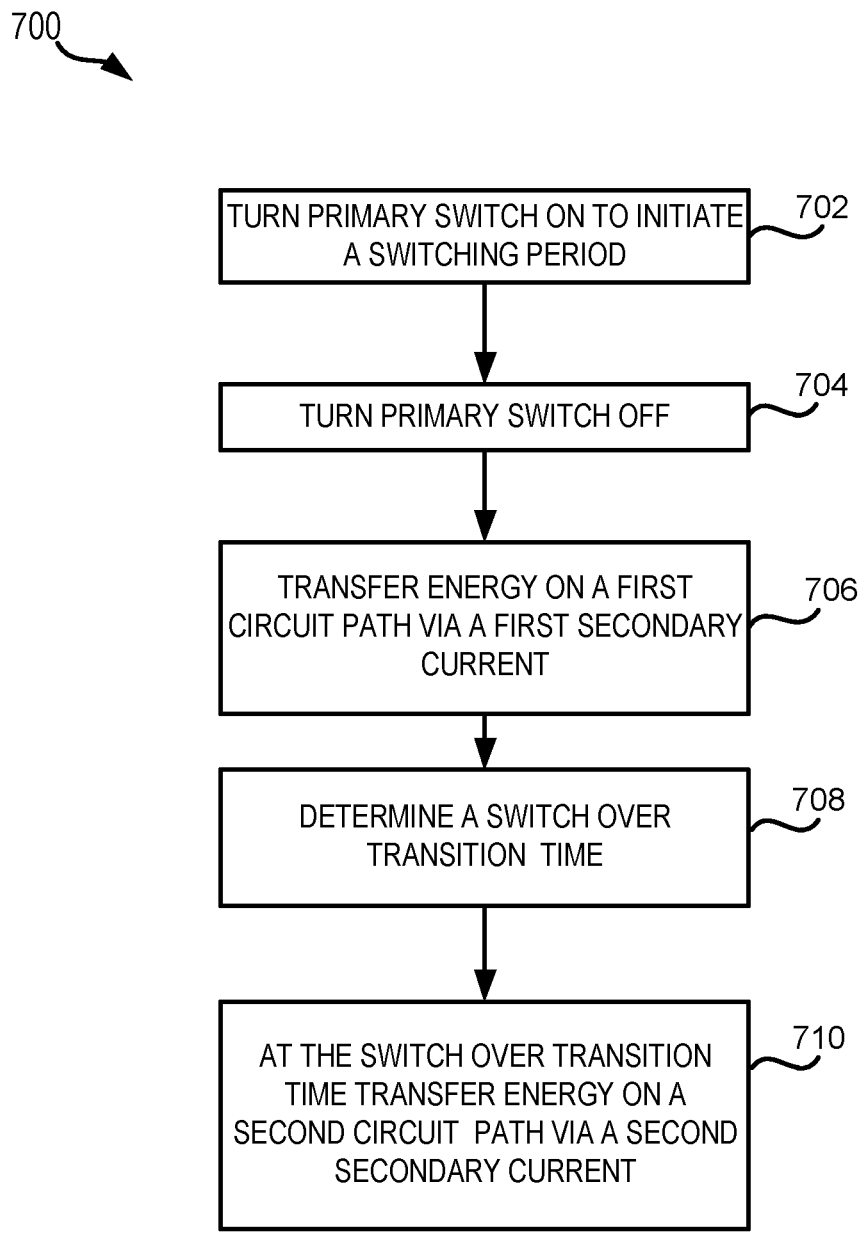
FIG. 7 illustrates a conceptual flow diagram for pulse sharing control in a multiple output power converter system according to an embodiment.

FIG. 7 illustrates a conceptual flow diagram 700 for pulse sharing control in a multiple output power converter system 100 according to an embodiment. Step 702 may correspond with turning on primary switch 152 during a switching period (e.g., a switching period T2 at time t2a and/or a switching period T5 at time t5a). Step 704 may correspond with turning the primary switch 152 off (e.g., at time t2b and/or at time t5b). Step 706 may correspond with transferring energy to a first load port (e.g., any one of the CC/CV3 port, CC/CV2 port, and CC/CV1 port of multiple loads 106). Energy may be transferred on a first circuit path (e.g., circuit path 111) via a first secondary current (e.g., secondary current $I_{S3}$). Step 708 may correspond with determining a switch over transition time SWT (see, e.g., step 618 of subroutine 610 and/or step 635 or subroutine 612). At the switch over transition time SWT (e.g., transition time t20s of FIG. 2E), energy may be transferred on a second circuit path (e.g., circuit path 115). Step 710 may correspond with transferring energy via the second circuit path via second secondary current (e.g., secondary current $I_{S1}$). In this way energy may be shared to secondary second load port (e.g., the CC/CV1 port or CC/CV2 port of multiple loads 106).

Although the multiple output power converter system 100 illustrates a switch-mode configuration (e.g., a flyback configuration) for providing multiple outputs $V_{O1}$-$V_{O3}$ with corresponding secondary currents $I_{S1}$-$I_{S3}$, other configurations with greater or fewer multiple outputs are possible. For instance, the teachings herein may also be applicable to forward converters and/or other converter topologies using transformers having multiple secondary windings.

It is appreciated that in the description and example drawings, the concept of independently controlled CC/CV multiple outputs has been illustrated mostly with series couplings of the secondary windings on the energy transfer element (e.g., transformer). However, it should not be considered as a limitation and it is appreciated that based on the application and the load power requirement on each of multiple outputs, the independently regulated CV/CC outputs may be arranged in any coupling combination of series windings, parallel windings, or both series windings and parallel windings with a common return line for all of the independently controlled and regulated outputs in accordance with the teachings herein.

The proposed converter topology is one example of a single stage multiple output flyback converter targeting applications with multiple independently regulated constant voltage and/or constant current outputs. Example targets for such products may include monitor and television applications, which include a CC controlled output for the parallel strings (e.g., arrays) of backlight LEDs requiring regulated adjustable (e.g., dimming) constant current output with for example a 40-50V voltage drop plus one or more CV controlled outputs for powering logic, universal serial bus (USB), and audio that should satisfy a strict regulation accuracy requirement for each output.

The above description of illustrated examples of the present disclosure, including what is described in the Abstract, are not intended to be exhaustive or to be limitation to the precise forms disclosed. While specific embodiments of, and examples for reducing audible noise in multiple output power converter systems are described herein for illustrative purposes, various equivalent modifications are possible without departing from the broader spirit and scope of the present disclosure. Indeed, it is appreciated that the specific example voltages, currents, frequencies, power range values, times, etc., are provided for explanation purposes and that other values may also be employed in other embodiments and examples in accordance with the teachings herein.

Although the present invention is defined in the claims, it should be understood that the present invention can alternatively be defined in accordance with the following examples.

Example 1

A method of pulse sharing control in a multiple output power converter system during a switching period comprising: closing a primary switch to energize an energy transfer element via a primary current; opening the primary switch; transferring energy to a first load port on a first circuit path via a first secondary current; determining a switch over transition time; and at the switch over transition time transferring energy to a second load port on a second circuit path via a second secondary current.

Example 2

The method of example 1, wherein the switching period is a discontinuous conduction mode (DCM) switching period.

Example 3

The method of any one of the preceding examples, wherein the first load port is a constant current (CC) port.

Example 4

The method of any one of the preceding examples, wherein the first load port is a constant voltage (CV) port.

Example 5

The method of any one of the preceding examples, wherein a voltage of the first load port is greater than a voltage of the second load port.

Example 6

The method of any one of the preceding examples, wherein at the switch over transition time transferring energy to the second load port on the second circuit path via the second secondary current comprises: providing a voltage between three volts and forty volts.

Example 7

The method of any one of the preceding examples, wherein transferring energy to the first load port on the first circuit path via the first secondary current comprises: providing a voltage between three volts and one hundred volts.

Example 8

The method of any one of the preceding examples, wherein transferring energy to the first load port on the first circuit path via the first secondary current comprises: providing the first secondary current to at least one light emitting diode (LED).

Example 9

The method of any one of the preceding examples, wherein at the switch over transition time transferring energy to the second load port via the second secondary current comprises: closing a secondary switch.

Example 10

The method of any one of the preceding examples, wherein at the switch over transition time transferring energy to the second load port via the second secondary current comprises: measuring a forward pin signal.

Example 11

The method of any one of the preceding examples, wherein the forward pin signal is a secondary winding voltage.

Example 12

A multiple output power converter system comprising: an energy transfer element comprising a primary winding and multiple secondary windings, the primary winding configured to receive energy from a first power supply; a primary switch electrically coupled to the primary winding and configured to switch according to a switching cycle; a first circuit path electrically coupled to a first load port; a second circuit path electrically coupled to a second load port; and a secondary controller configured to provide a first secondary current on the first circuit path and to subsequently, at a switch over transition time, provide a second secondary current on the second circuit path during the switching cycle.

Example 13

The multiple output power converter system of any one of the preceding examples, wherein the switching cycle is a discontinuous conduction mode (DCM) switching cycle.

Example 14

The multiple output power converter system of any one of the preceding examples, wherein the first load port is a constant current (CC) port.

Example 15

The multiple output power converter system of any one of the preceding examples, wherein the first load port is a constant voltage (CV) port.

Example 16

The multiple output power converter system of any one of the preceding examples, wherein a voltage of the first load port is greater than a voltage of the second load port.

Example 17

The multiple output power converter system of any one of the preceding examples, wherein the second load port is a constant voltage (CV) port.

Example 18

The multiple output power converter system of any one of the preceding examples, wherein the second load port is port is configured to receive a voltage between three volts and forty volts.

Example 19

The multiple output power converter system of any one of the preceding examples, wherein the first load port is configured to receive a voltage between three volts and one hundred volts.

Example 20

The multiple output power converter system of any one of the preceding examples, wherein the first circuit path is configured to provide the first secondary current to at least one light emitting diode (LED).

Example 21

The multiple output power converter system of any one of the preceding examples, wherein the secondary controller comprises pulse sharing control circuits.

Example 22

The multiple output power converter system of any one of the preceding examples, wherein the pulse sharing control circuits are configured to determine a pulse width of the first secondary current and a pulse width of the second secondary current.

What is claimed is:

1. A method of pulse sharing control in a multiple output power converter system during a switching period comprising:
    closing a primary switch to energize an energy transfer element via a primary current;
    opening the primary switch only once during the switching period;
    transferring energy to a first load port on a first circuit path via a first secondary current;
    adjusting a switch over transition time to vary a pulse width of the first secondary current; and
    at the switch over transition time transferring energy to a second load port on a second circuit path via a second secondary current,
    wherein either the first load port or the second load port is a highest voltage port, and wherein the first secondary current and the second secondary current are unidirectional.

2. The method of claim 1, wherein the switching period is a discontinuous conduction mode (DCM) switching period.

3. The method of claim 1, wherein the first load port is a constant current (CC) port.

4. The method of claim 1, wherein the first load port is a constant voltage (CV) port.

5. The method of claim 1, wherein a voltage of the first load port is greater than a voltage of the second load port.

6. The method of claim 1, wherein at the switch over transition time transferring energy to the second load port on the second circuit path via the second secondary current comprises:

providing a voltage between three volts and forty volts.

7. The method of claim 1, wherein transferring energy to the first load port on the first circuit path via the first secondary current comprises:

providing a voltage between three volts and one hundred volts.

8. The method of claim 1, wherein transferring energy to the first load port on the first circuit path via the first secondary current comprises:

providing the first secondary current to at least one light emitting diode (LED).

9. The method of claim 1, wherein at the switch over transition time transferring energy to the second load port via the second secondary current comprises:

closing a secondary switch.

10. The method of claim 9, wherein at the switch over transition time transferring energy to the second load port via the second secondary current comprises:

measuring a forward pin signal.

11. The method of claim 10, wherein the forward pin signal is a secondary winding voltage.

12. A multiple output power converter system comprising:
- an energy transfer element comprising a primary winding and multiple secondary windings, the primary winding configured to receive energy from a first power supply;
- a primary switch electrically coupled to the primary winding and configured to turn off only once during a switching cycle;
- a first circuit path electrically coupled to a first load port;
- a second circuit path electrically coupled to a second load port; and
- a secondary controller configured to provide a first secondary current on the first circuit path, to vary a pulse width of the first secondary current with an adjustable switch over transition time, and to subsequently, at the adjustable switch over transition time, provide a second secondary current on the second circuit path during the switching cycle,
- wherein either the first load port or the second load port is a highest voltage port, and wherein the first secondary current and the second secondary current are unidirectional.

13. The multiple output power converter system of claim 12, wherein the switching cycle is a discontinuous conduction mode (DCM) switching cycle.

14. The multiple output power converter system of claim 12, wherein the first load port is a constant current (CC) port.

15. The multiple output power converter system of claim 12, wherein the first load port is a constant voltage (CV) port.

16. The multiple output power converter system of claim 12, wherein a voltage of the first load port is greater than a voltage of the second load port.

17. The multiple output power converter system of claim 12, wherein the second load port is a constant voltage (CV) port.

18. The multiple output power converter system of claim 12, wherein the second load port is configured to receive a voltage between three volts and forty volts.

19. The multiple output power converter system of claim 12, wherein the first load port is configured to receive a voltage between three volts and one hundred volts.

20. The multiple output power converter system of claim 12, wherein the first circuit path is configured to provide the first secondary current to at least one light emitting diode (LED).

21. The multiple output power converter system of claim 12, wherein the secondary controller comprises pulse sharing control circuits.

22. The multiple output power converter system of claim 21, wherein the pulse sharing control circuits are configured to determine the pulse width of the first secondary current and a pulse width of the second secondary current.

\* \* \* \* \*